US010229862B2

(12) United States Patent
Zhamu et al.

(10) Patent No.: US 10,229,862 B2
(45) Date of Patent: Mar. 12, 2019

(54) THERMAL MANAGEMENT SYSTEM CONTAINING A GRAPHENE OXIDE-COATED GRAPHITIC FOIL LAMINATE FOR ELECTRONIC DEVICE APPLICATION

(71) Applicant: Nanotek Instruments, Inc., Dayton, OH (US)

(72) Inventors: Aruna Zhamu, Springboro, OH (US); Mingchao Wang, Miamisburg, OH (US); Wei Xiong, Dayton, OH (US); Bor Z. Jang, Centerville, OH (US)

(73) Assignee: Nanotek Instruments, Inc., Dayton, OH (US)

( * ) Notice: Subject to any disclaimer, the term of this patent is extended or adjusted under 35 U.S.C. 154(b) by 478 days.

(21) Appl. No.: 13/694,162

(22) Filed: Nov. 2, 2012

(65) Prior Publication Data
US 2014/0124176 A1    May 8, 2014

(51) Int. Cl.
*H01L 23/373* (2006.01)
*F28F 21/02* (2006.01)
*F28F 3/00* (2006.01)

(52) U.S. Cl.
CPC .............. *H01L 23/373* (2013.01); *F28F 3/00* (2013.01); *F28F 21/02* (2013.01); *H01L 2924/0002* (2013.01)

(58) Field of Classification Search
CPC ............ F28F 21/02; F28F 3/00; H01L 23/373
USPC .......................................... 165/185; 361/704
See application file for complete search history.

(56) References Cited

U.S. PATENT DOCUMENTS

| 3,404,061 A | 10/1968 | Shane et al. |
| 7,071,258 B1 | 7/2006 | Jang et al. |
| 2005/0111189 A1* | 5/2005 | Smalc et al. .................. 361/700 |
| 2005/0271574 A1 | 12/2005 | Jang et al. |
| 2006/0035085 A1* | 2/2006 | Ozaki .................... B82Y 30/00 428/408 |
| 2006/0056157 A1* | 3/2006 | Ford et al. .................... 361/704 |

(Continued)

OTHER PUBLICATIONS

Angstron, "High Quality Graphene Oxide Product," Nov. 2010 (via Wayback Machine).*

(Continued)

*Primary Examiner* — Eric Ruppert

(57) ABSTRACT

A heat dissipation system, comprising: (a) an electronic device comprising a heat source, wherein the heat source transmits heat to a second component or an external surface of the device; (b) a heat-conducting layer being positioned such that one of its major surfaces is in operative contact with the heat source such that it is interposed between the heat source and the second component or the external surface. The heat-conducting layer comprises at least one graphene oxide-coated graphitic foil laminate which thermally shields the second component or the external surface from heat generated by the heat source, and wherein the laminate is composed of a graphitic substrate/core layer with at least one primary surface coated with a graphene oxide coating layer. This graphene oxide-coated laminate exhibits a combination of exceptional thermal conductivity, electrical conductivity, mechanical strength, surface hardness, and scratch resistance, making this the most effective heat dissipation system.

26 Claims, 9 Drawing Sheets

(56) References Cited

U.S. PATENT DOCUMENTS

| | | | |
|---|---|---|---|
| 2007/0053168 A1* | 3/2007 | Sayir | B32B 18/00 361/718 |
| 2008/0048152 A1 | 2/2008 | Jang et al. | |
| 2008/0248275 A1 | 10/2008 | Jang et al. | |
| 2010/0085713 A1 | 4/2010 | Balandin et al. | |
| 2010/0128439 A1* | 5/2010 | Tilak et al. | 361/709 |
| 2010/0140792 A1 | 6/2010 | Haddon et al. | |
| 2010/0143798 A1* | 6/2010 | Zhamu et al. | 429/212 |
| 2011/0108978 A1 | 5/2011 | Kim et al. | |
| 2013/0236715 A1 | 9/2013 | Zhamu et al. | |

OTHER PUBLICATIONS

U.S. Appl. No. 10/858,814, filed Jun. 3, 2004, B. Z. Jang, et al.
U.S. Appl. No. 11/509,424, filed Aug. 25, 2006, B. Z. Jang, et al.
U.S. Appl. No. 11/784,606, filed Apr. 9, 2007, A. Zharmu, et al.
U.S. Appl. No. 13/385,813, filed Mar. 8, 2012, A. Zhamu, et al.
Mochida, Isao, Seong-Ho Yoon, and Wenming Qiao. "Catalysts in syntheses of carbon and carbon precursors." Journal of the Brazilian Chemical Society 17.6 (2006): 1059-1073.

* cited by examiner (Scale bar = 5 μm per interval)

THERMAL MANAGEMENT SYSTEM CONTAINING A GRAPHENE OXIDE-COATED GRAPHITIC FOIL LAMINATE FOR ELECTRONIC DEVICE APPLICATION

The present invention claims the benefits of the following co-pending patent applications: A. Zhamu, et al., "Graphene Oxide Gel Bonded Graphene Composite Films and Processes for Producing Same," U.S. patent application Ser. No. 13/385,813 (Mar. 8, 2012); and A. Zhamu, et al., "Graphene Oxide-Coated Graphitic Foil and Processes for Producing Same," US Patent Application submitted concurrently with the instant application.

FIELD OF THE INVENTION

The present invention relates generally to the field of graphitic materials for heat dissipation applications, and more particularly to graphene oxide-coated graphitic foil laminates that exhibit a combination of an exceptionally high thermal conductivity, high electrical conductivity, high mechanical strength, surface scratch resistance, and hardness.

BACKGROUND OF THE INVENTION

Carbon is known to have five unique crystalline structures, including diamond, fullerene (O-D nano graphitic material), carbon nano-tube (1-D nano graphitic material), graphene (2-D nano graphitic material), and graphite (3-D graphitic material).

The carbon nano-tube (CNT) refers to a tubular structure grown with a single wall or multi-wall, which can be conceptually obtained by rolling up a graphene sheet or several graphene sheets to form a concentric hollow structure. Carbon nano-tubes have a diameter on the order of a few nanometers to a few hundred nanometers. Its longitudinal, hollow structure imparts unique mechanical, electrical and chemical properties to the material.

A graphene plane in a graphite crystal is composed of carbon atoms occupying a two-dimensional, hexagonal lattice. The constituent graphene planes of a graphite crystal can be extracted or isolated from a graphite crystal to form individual graphene sheets. An isolated, individual graphene sheet is commonly referred to as single-layer graphene. A stack of multiple graphene planes bonded through van der Waals forces in the thickness direction is commonly referred to as a multi-layer graphene, typically having up to 300 layers or graphene planes (<100 nm in thickness), but more typically up to 30 graphene planes (<10 nm in thickness), even more typically up to 20 graphene planes (<7 nm in thickness), and most typically up to 10 graphene planes (commonly referred to as few-layer graphene in scientific community). Single-layer graphene and multi-layer graphene sheets are collectively called "nano graphene platelets" (NGPs). Our research group pioneered the development of graphene materials and related production processes as early as 2002: (1) B. Z. Jang and W. C. Huang, "Nano-scaled Graphene Plates," U.S. Pat. No. 7,071,258 (Jul. 4, 2006), application submitted in October 2012; (2) B. Z. Jang, et al. "Process for Producing Nano-scaled Graphene Plates," U.S. patent application Ser. No. 10/858,814 (Jun. 3, 2004); and (3) B. Z. Jang, A. Zhamu, and J. Guo, "Process for Producing Nano-scaled Platelets and Nanocomposites," U.S. patent application Ser. No. 11/509,424 (Aug. 25, 2006).

NGPs are typically obtained by intercalating natural graphite flakes with a strong acid and/or oxidizing agent to obtain a graphite intercalation compound (GIC) or graphite oxide, as illustrated in FIG. 1. This is most often accomplished by immersing natural graphite flakes in a mixture of sulfuric acid, nitric acid (an oxidizing agent), and another oxidizing agent (e.g. potassium permanganate or sodium chlorate). The resulting GIC is actually some type of graphite oxide particles. This GIC is then repeatedly washed and rinsed in water to remove excess acids, resulting in a graphite oxide suspension or dispersion which contains discrete and visually discernible graphite oxide particles dispersed in water. There are two processing routes to follow after this rinsing step:

Route 1 involves removing water from the suspension to obtain "expandable graphite," which is essentially a mass of dried GIC or dried graphite oxide particles. Upon exposure of expandable graphite to a temperature in the range of typically 800-1,050° C. for approximately 30 seconds to 2 minutes, the GIC expands by a factor of 30-300 to form "graphite worms," which are each a collection of exfoliated, but largely un-separated or interconnected graphite flakes. In Route 1A, these graphite worms (exfoliated graphite or "networks of interconnected/non-separated graphite flakes") can be re-compressed to obtain flexible graphite sheets that typically have a thickness in the range of 0.125 mm (125 µm)-0.5 mm (500 µm). One may choose to use a low-intensity air mill or shearing machine to simply break up the graphite worms for the purpose of producing the so-called "expanded graphite," which contain mostly graphite flakes having a thickness greater than 100 nm (hence, not a nano material by definition).

Exfoliated graphite worms, expanded graphite, and the recompressed mass of graphite worms (commonly referred to as flexible graphite sheet or flexible graphite foil) remain as a 3-D graphitic material that is fundamentally different and patently distinct from either the 1-D nano carbon material (CNT) or the 2-D nano carbon material (graphene).

As disclosed by M. Smalc, et al, U.S. Pat. No. 7,292,441 (Nov. 6, 2007) and U.S. Pat. No. 6,982,874 (Jun. 3, 2006), and J. W. Tzeng, U.S. Pat. No. 6,482,520 (Nov. 19, 2002), these flexible graphite (FG) foils can be used as a heat spreader material, but exhibiting a maximum in-plane thermal conductivity of typically less than 500 W/mK (more typically <300 W/mK) and in-plane electrical conductivity no greater than 1,500 S/cm.

In Route 1B, the exfoliated graphite is subjected to high-intensity mechanical shearing (e.g. using an ultrasonicator, high-shear mixer, high-intensity air jet mill, or high-energy ball mill) to form separated single-layer and multi-layer graphene sheets (collectively, NGPs), as disclosed in our U.S. application Ser. No. 10/858,814. Single-layer graphene can be as thin as 0.34 nm, while multi-layer graphene can have a thickness up to 100 nm. In the present application, the thickness of multi-layer NGPs is preferably less than 20 nm.

Route 2 entails ultrasonicating the graphite oxide suspension for the purpose of separating/isolating individual graphene oxide sheets from graphite oxide particles. This is based on the notion that the inter-graphene plane separation bas been increased from 0.335 nm in natural graphite to 0.6-1.1 nm in highly oxidized graphite oxide, significantly weakening the van der Waals forces that hold neighboring planes together. Ultrasonic power can be sufficient to further separate graphene plane sheets to form separated, isolated, or discrete graphene oxide (GO) sheets. These graphene oxide sheets can then be chemically or thermally reduced to obtain "reduced graphene oxides" (RGO) typically having an oxygen content of 0.01%-10% by weight, more typically 0.01%-5% by weight.

For the purpose of defining the claims of the instant application, NGPs include single-layer and multi-layer graphene or reduced graphene oxide with an oxygen content of 0-10% by weight, more typically 0-5% by weight, and preferably 0-2% weight. Pristine graphene has essentially 0% oxygen. Graphene oxide (including RGO) can have 0.01%-46% by weight of oxygen. The graphene oxide gel, to be described in detail later, typically contains 20-46% by weight oxygen.

It may be noted that flexible graphite sheets or foils (obtained by re-compressing exfoliated graphite worms) for electronic device thermal management applications (e.g. as a heat spreader) have the following major deficiencies:

(1) As indicated earlier, flexible graphite (FG) foils exhibit a relatively low thermal conductivity, typically <500 W/mK and more typically <300 W/mK.

(2) Flexible graphite foils are also of low strength and poor structural integrity. The high tendency for flexible graphite foils to get torn apart makes them difficult to handle in the process of integrating them in a microelectronic device.

(3) Another very subtle, largely ignored or overlooked, but critically important feature of FG foils is their high tendency to get flaky with graphite flakes easily coming off from FG sheet surfaces and emitting out to other parts of a microelectronic device. These highly electrically conducting flakes (typically 1-500 µm in lateral dimensions and >100 nm in thickness) can cause internal shorting and failure of electronic devices.

(4) For this reason, it is necessary to apply a protective resin coating onto a surface or on both surfaces of a flexible graphite foil in order to prevent graphite flakes from being released. This resin coating is typically not a thermally or electrically conductive material that is often an undesirable feature in a situation where high conductivity is required. In other situations where electrical insulation or isolation is required, this resin layer can present some issues (e.g. mis-match in coefficients of thermal expansion and elastic constants between the FG layer and the resin coating, resulting in delamination or peeling-off after some number of thermal cycles).

Other sheet-like graphitic structures intended for use as a heat spreader or thermal interface material include carbon nano-tube (CNT) paper (e.g. Bucky paper), carbon fiber mat (e.g. carbon nano-fiber or CNF mat), and carbon paper (e.g. made of short carbon fibers). These graphitic sheets also suffer from similar shortcomings as FG foils. For instance, although individual CNTs or CNFs can exhibit a high thermal conductivity (1,500-3000 W/mK), the resulting CNT or CNF paper or mat typically exhibit an in-plane thermal conductivity less than 100 W/mK and often less than 10 W/mK, likely due to few and poor contacts between individual CNT or CNF filaments, providing insufficient cross-sections for electron flow or impeding electron flow. Further, the contact between a sheet-like graphitic layer and a heat source is usually poor due to limited contact surfaces between such a graphitic layer (e.g. CNT paper) and a rigid device component (e.g. a CPU in a mobile phone). This results in an ineffective heat transfer between the heat source and the graphitic layer.

Similarly, the NGPs, when packed into a film or paper sheet of non-woven aggregates, exhibit a thermal conductivity higher than 1,000 W/mK only when the film or paper is cast and pressed into a sheet having a thickness lower than 10 µm, and higher than 1,500 W/mK only when the film or paper is cast and pressed into a sheet having a thickness lower than 1 µm. This is reported in our earlier U.S. patent application Ser. No. 11/784,606 (Apr. 9, 2007). However, ultra-thin film or paper sheets (<10 µm) are difficult to produce in mass quantities, and difficult to handle when one tries to incorporate these thin films as a heat spreader material during the manufacturing of microelectronic devices. Further, thickness dependence of thermal conductivity (not being able to achieve a high thermal conductivity at a wide range of film thicknesses) is not a desirable feature. Non-woven aggregates of NGPs (graphene sheets or platelets) also have a tendency to get flaky.

Our earlier application (U.S. application Ser. No. 11/784,606) further disclosed a mat, film, or paper of NGPs infiltrated with a metal, glass, ceramic, resin, and CVD graphite matrix material. Later on, Haddon, et al (US Pub. No. 2010/0140792, Jun. 10, 2010) also reported NGP thin film and NGP-polymer composites for thermal management applications. The processes used by Haddon et al to produce NGPs are identical to those disclosed much earlier by us (Jang, et al. U.S. patent application Ser. No. 10/858,814 (Jun. 3, 2004)). The NGP-polymer composites, as an intended thermal interface material, have very low thermal conductivity, typically <<2 W/mK. The NGP films of Haddon, et al are essentially non-woven aggregates of graphene platelets, identical to those of our earlier invention (U.S. application Ser. No. 11/784,606). Again, these aggregates have a great tendency to have graphite particles flaking and separated from the film surface, creating internal shorting problem for the electronic device containing these aggregates. They also exhibit low thermal conductivity unless made into thin films (10 nm-300 nm, as reported by Haddon, et al) which are very difficult to handle in a real device manufacturing environment. Balandin, et al (US Pub. No. 2010/0085713, Apr. 8, 2010) also disclosed a graphene layer produced by CVD deposition or diamond conversion for heat spreader application. More recently, Kim, et al (N. P. Kim and J. P. Huang, "Graphene Nanoplatelet Metal Matrix," US Pub. No. 2011/0108978, May 10, 2011) reported metal matrix infiltrated NGPs. However, metal matrix material is too heavy and the resulting metal matrix composite does not exhibit a high thermal conductivity.

Another prior art material for thermal management application is the pyrolitic graphite film. The lower portion of FIG. 1 illustrates a typical process for producing prior art pyrolitic graphitic films or sheets. The process begins with carbonizing a polymer 46 at a carbonization temperature of 500-1,000° C. for 2-10 hours to obtain a carbonized material 48, which is followed by a graphitization treatment at 2,500-3,200° C. for 5-24 hours to form a graphitic film 50. This is a slow, tedious, and energy-intensive process. Furthermore, carbonization of certain polymers (e.g. polyacrylonitrile) involves the emission of toxic species.

Thus, it is an object of the present invention to provide a thermal management system containing an electronic device, and a highly thermally conductive thin film laminate for use as a heat spreader and/or thermal shield to protect this electronic device. This laminate is composed of a graphitic core or substrate layer (having two primary, opposed surfaces) and a graphene oxide (GO) coating layer deposited on one primary surface of the core/substrate layer, or two graphene oxide coating layers deposited on the two primary surfaces of the core graphitic layer. The graphitic substrate layer can include, but not limited to, flexible graphite foil, graphene film, graphene paper, graphite particle paper, carbon-carbon composite film, carbon nano-fiber paper, or carbon nano-tube paper.

The present invention also provides a method or process for producing such a GO-coated laminate for use as a heat spreader layer in a thermal management system. The graphene oxide (GO) coating layer is initially a layer of GO gel when the gel is first deposited onto a primary surface of a graphitic core/substrate layer. The liquid component of this GO gel is then partially or totally removed and, concurrently or sequentially, this GO coating layer is thermally converted to an integrated graphene film obtained by heat-treating graphene oxide gel to merge individual graphene oxide molecules in an edge-to-edge manner.

This thermally conductive laminate can be used for thermal management applications (e.g. for use as a heat spreader) in a microelectronic device, such as a mobile phone (including a smart phone), a notebook computer, a tablet, an e-book, a telecommunication device, and any hand-held computing device or portable microelectronic device.

A particular object of the present invention is to provide a heat dissipation system, comprising: (a) an electronic device comprising a heat source, wherein the heat source transmits heat to a second component or an external surface of the electronic device; (b) a heat-conducting layer comprising two major surfaces, the heat-conducting layer being positioned such that one of its major surfaces is in operative contact with the heat source such that it is interposed between the heat source and the second component or the external surface of the electronic device. The heat-conducting layer comprises at least one graphene oxide-coated graphitic foil laminate which thermally shields the second component or the external surface of the electronic device from heat generated by the heat source.

It is another object of the present invention to provide a GO-coated graphitic laminate (for a heat spreader system) that exhibits a combination of exceptional thermal conductivity, electrical conductivity, mechanical strength, surface smoothness, surface hardness, and scratch resistance unmatched by any thin-film material of comparable thickness range.

Still another object of the present invention is to provide a heat spreader system that contains a GO-coated 2-layer or 3-layer laminate (or n-layer, n being up to 1000) that exhibits exceptional thermal conductivity, electrical conductivity, strength, and reduced or eliminated tendency to flake-off.

It is yet another object of the present invention to provide a heat spreader system that contains a highly conductive GO-coated laminate thin-film sheet that meets the following technical requirements (a) in-plane thermal conductivity greater than 600 W/mK (preferably greater than 1,000 W/mK, and further preferably greater than 1,700 W/mK); (b) in-plane electrical conductivity is greater than 2,000 S/cm (preferably >3,000 S/cm, more preferably >5,000 S/cm, and most desirably >10,000 S/cm); (c) Rockwell surface hardness value >60 (preferably >80); and/or (d) a tensile strength greater than 10 MPa (preferably >40 MPa, more typically >60 MPa, and most preferably >100 MPa).

Another object of the present invention is to provide a heat spreader system that contains an electrically and thermally conductive graphitic laminate that contains a unitary graphene oxide layer or graphene single crystal coated on a major surface of a graphitic substrate layer.

SUMMARY OF THE INVENTION

The present invention provides a heat dissipation system that comprises: (a) an electronic device comprising a heat source, wherein the heat source transmits heat to a second component or an external surface of the electronic device; (b) a heat-conducting layer comprising two major surfaces, the heat-conducting layer being positioned such that one of its major surfaces is in operative contact with the heat source such that it is interposed between the heat source and the second component or the external surface of the electronic device. The heat-conducting layer comprises at least one graphene oxide-coated graphitic foil laminate which thermally shields the second component or the external surface of the electronic device from heat generated by the heat source.

The electronic device may be selected from a digital camera, a mobile phone, a laptop computer, a tablet, an electronic book or e-book, a power tool, or a hand-held video recording device. The electronic device can be any computing device that contains a CPU, a battery, a super-capacitor, or a light-emitting diode.

In this heat dissipation system, the graphene oxide-coated graphitic foil has a unique combination of outstanding thermal conductivity, electrical conductivity, mechanical strength, and scratch resistance (including reduction or elimination of the tendency for surface graphite flakes or particles to "flake off"). These outstanding properties, alone or in combination, are a surprising result of the unique and synergistic combination of a graphitic core (or substrate) material and a graphene oxide-based coating or skin material.

This multi-layer structure (2-layer, 3-layer, or a higher number of layers), as a heat spreader layer, is composed of a graphitic substrate (or core) layer having two opposed primary surfaces and at least a graphene oxide coating layer deposited on at least one of the primary surfaces, wherein the graphitic substrate layer has a thickness greater than 0.34 nm (preferably from 0.34 nm to 10 mm, further preferably from 1 nm to 1 mm), and the graphene oxide coating layer has a thickness greater than 0.5 nm (preferably from 0.5 nm to 10 mm and further preferably from 1 nm to 1 mm) and an oxygen content of 0.01%-40% by weight based on the total graphene oxide weight. Preferably, both of the two primary surfaces are each deposited with a graphene oxide-based coating layer. The aforementioned 2-layer or 3-layer structure can be a building block for a multi-layer structure or laminate.

Preferably, the two opposed surfaces are substantially parallel to each other, but this is not a requirement for the core or substrate layer. The thickness of this layer is preferably uniform across the length and width; but, again, this is not a requirement either.

Either the graphitic substrate layer or graphene oxide coating layer, or both, preferably has a thickness less than 200 μm. Further preferably, the graphitic substrate layer and/or the graphene oxide coating layer has a thickness greater than 10 μm, but less than 100 μm.

The graphitic substrate or core layer may be selected from flexible graphite foil, graphene film, graphene paper (including graphene oxide paper, graphene fluoride paper, doped graphene paper, functionalized graphene paper, etc), graphite particle paper, carbon-carbon composite film, carbon nano-fiber paper, or carbon nano-tube paper.

Particularly useful is a graphene oxide-coated graphitic foil as defined above, wherein the graphitic substrate layer is a flexible graphite foil produced by re-compression of exfoliated graphite worms or exfoliated graphite flakes of natural graphite and/or artificial graphite. The flexible graphite sheet or foil prepared by re-compressing (e.g. roll-pressing) exfoliated graphite worms or flakes has a great tendency to flake off, emitting graphite flakes into air and eventually relocating to a dangerous spot (e.g. where the presence of graphite flakes could cause internal short-circuiting). Further, flexible graphite sheets or foils are relatively brittle and weak, and hence are difficult to handle in an actual microelectronic device manufacturing environment. These and other major issues associated with the use of flexible graphite sheets in a microelectronic device for a thermal management purpose have been effectively overcome surprisingly by the presently invented approach of coating the flexible graphite sheets with one graphene oxide coating layer on one or both primary surfaces.

A most useful graphene oxide-coated graphitic foil is one that contains a graphene film as a graphitic core or substrate layer. The graphene film may comprise a graphene material selected from pristine graphene, graphene oxide, reduced graphene oxide, graphene fluoride, hydrogenated graphene, doped graphene, functionalized graphene, or a combination thereof. The graphitic substrate layer may be a graphene film comprising a single-layer graphene sheet (one graphene plane of hexagonally organized carbon atoms) or a multiple-layer graphene platelet having less than 100 graphene planes. Preferably, the graphene film comprises multi-layer graphene sheets having a thickness of 6.7 nm to 20 nm. The graphene material in the substrate or core graphitic layer contains preferably pristine graphene that contains no oxygen.

The pristine graphene contains no oxygen and may be obtained from an oxidation-free procedure selected from direct ultrasonication, supercritical fluid intercalation, or alkali metal intercalation.

In the graphene oxide-coated graphitic foil as defined above, the graphene oxide has an oxygen weight fraction of 0.01% to 46%. The graphene oxide may be a reduced graphene oxide having an oxygen content of 0.01-5% by weight.

Preferably and typically, the graphene oxide coating comprises a unitary graphene layer or a single crystal of graphene planes obtained from a heat treatment of graphene oxide gel. This unitary graphene entity can cover the entire coating length or width. In the unitary graphene layer or graphene single crystal, the graphene plane (of hexagonal carbon atoms) is parallel to the layer surface (substantially parallel to either primary surface of the graphitic core layer). Each unitary graphene layer is a large-scale entity derived from originally separated GO molecules (aromatic molecules) that are linked, merged, or united to form an integrated layer of highly ordered structure of carbon atoms. Depending upon the GO coating length and width, the unitary layer can be as wide as the coating length or width, which is typically 10 μm to 100 cm in our studies (more typically 50 μm to 50 cm, and most typically 100 μm to 10 cm).

Highly surprising and desirable for certain applications is a graphene oxide that has an oxygen weight fraction of 23% to 35%, which happens to be thermally conductive but not electrically conductive. It is well-known in the art that, with very few exceptions, a thermally conductive material is always electrically conductive. This discovery is highly unexpected.

The graphene oxide coating in the laminate preferably is obtained from a graphene oxide gel, which gel is composed of graphene oxide molecules dispersed in an acidic medium having a pH value of no higher than 5 and the graphene oxide molecules have an oxygen content no less than 20% by weight while in a gel state. In particular, the GO gel is obtained by immersing a graphitic material in a powder or fibrous form in an oxidizing liquid medium in a reaction vessel at a reaction temperature for a length of time sufficient to obtain a graphene oxide gel composed of graphene oxide molecules dispersed in the liquid medium and the graphene oxide molecules have an oxygen content no less than 20% by weight and a molecular weight less than 43,000 g/mole (preferably less than 4,000 g/mole) while in a gel state. More preferably, the graphene oxide molecules have a molecular weight between 200 g/mole and 4,000 g/mole while in a gel state. The graphene oxide coating may be obtained by depositing the graphene oxide gel to form a graphene oxide gel coating and removing the residual liquid from the coating. This liquid removal step is preferably followed by a step of subjecting the graphene oxide (typically along with the core layer) to a heat treatment temperature of at least 150° C. for thermal reduction and/or re-graphitization. The heat treatment temperature for re-graphitization can be in the range from 300° C. to 1,500° C., but is preferably at least 1,500° C. The particularly useful temperature range for re-graphitization is from 1,500° C. to 2,500° C. With a sufficiently high re-graphitization temperature, the graphene oxide coating forms into a unitary structure after the re-graphitization treatment.

The graphitic foil may contain a material selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. This graphitic material can be made into thin film, paper, or mat form.

The graphene oxide may be produced from heavy oxidation of a graphitic material selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

The graphene oxide-coated graphitic foil (the laminate) typically has an in-plane thermal conductivity greater than 1,000 W/mK (or a through-plane thermal conductivity less than 10 W/mK), but can reach or exceed an in-plane thermal conductivity of 1,700 W/mK (or a through-plane thermal conductivity lower than 5 W/mK). The laminate can exhibit an in-plane electrical conductivity greater than 3,000 S/cm, often reaching a value >10,000 S/cm. It is particularly desirable to have a coated laminate that exhibits an in-plane electrical conductivity greater than 3,000 S/cm (more desirably >5,000 S/cm) and an in-plane thermal conductivity greater than 1,000 W/mK, and this is what we can readily obtain.

We have also often observed that the GO-coated laminate often exhibits a unique combination of an in-plane electrical conductivity greater than 1,500 S/cm, an in-plane thermal conductivity greater than 600 W/mK, a physical density greater than 1.4 g/cm$^3$, and a tensile strength greater than 10 MPa. Most often the laminate shows a combination of an in-plane electrical conductivity greater than 2,000 S/cm, an in-plane thermal conductivity greater than 800 W/mK, a physical density greater than 1.8 g/cm$^3$, and a tensile strength greater than 40 MPa. In some cases, the GO-coated laminate exhibits a combination of an in-plane electrical conductivity greater than 3,000 S/cm (more typically >5,000 S/cm, and often greater than 10,000 S/cm), an in-plane thermal conductivity greater than 1,500 W/mK, a physical density greater than 2.0 g/cm$^3$, and a tensile strength greater than 60 MPa. These properties are also accompanied by a good surface smoothness (reduced roughness), surface hardness, scratch resistance, and reduced or eliminated tendency to flake-off (hence, not emitting loose flakes into air).

In certain application situations, at least one of the graphene oxide coating layers is further deposited with a layer of electrically insulating material (e.g. epoxy resin) thereon.

Preferably, the graphene oxide coating has an oxygen content of 0.01-10% by weight based on the total graphene oxide weight (most preferably <5%). A high temperature treatment (e.g., >2,500° C. for one hour) can completely eliminate oxygen. The graphene oxide may be obtained from a graphene oxide gel. This gel is obtained by immersing a graphitic material in a powder or fibrous form in a strong oxidizing liquid in a reaction vessel at a reaction temperature for a length of time sufficient to obtain a graphene oxide gel. This graphene oxide gel has the characteristics that it is optically transparent or translucent and visually homogeneous with no discernible discrete graphene or graphene oxide sheets dispersed therein. In contrast, conventional suspension of discrete graphene or graphene oxide sheets, or graphite flakes looks opaque, dark, black or heavy brown in color with individual graphene sheets, graphene oxide sheets, or graphite flakes being discernible or recognizable with naked eyes.

The graphene oxide molecules dissolved in the liquid medium of a graphene oxide gel are aromatic chains that have an average number of benzene rings in the chain typically less than 1000, more typically less than 500, and most typically less than 100. Most of the molecules have more than 5 or 6 benzene rings (mostly >10 benzene rings) from combined atomic force microscopy, high-resolution TEM, and molecular weight measurements. These benzene-ring type of aromatic molecules have been heavily oxidized and contain functional groups, such as —COOH and —OH and, therefore, are "soluble" (not just dispersible) in polar solvents, such as water.

These soluble molecules behave like resins and are surprisingly capable of serving as a coating material that well-adheres to a surface of a graphitic layer to form a laminated film of good structural integrity and high thermal conductivity. By contrast, conventional discrete graphene or graphene oxide sheets do not have any coating or adhesion power. These sheets would just form a loosely packed mass of un-bonded particles that does not have any structural integrity.

The present invention also provides a heat spreader or heat sink product for use in a hand-held device, such as a power tool, a microelectronic or telecommunication device (e.g. mobile phone, tablet, laptop computer, LCD display, etc), a light-emitting diode (LED) lighting device or system. The light weight (lower density compared to metal and ceramic materials), exceptional thermal conductivity, relatively high structural integrity, superior surface hardness and scratch resistance, and eliminated or significantly reduced tendency to emit free graphite or carbon particles into air make the invented graphene oxide-coated graphitic layer an ideal thermal management material.

The present invention also provides a process for producing a graphene oxide-coated graphitic layer. The process entails: (a) preparing a core or substrate layer of a graphitic material; (b) preparing a graphene oxide gel having graphene oxide molecules dispersed in a fluid medium, wherein the graphene oxide gel is optically transparent or translucent; (c) depositing graphene oxide gel onto a surface of the core or substrate layer to form a coating thereon; and (d) removing the fluid medium from the coating. This is preferably followed by a step of heat-treating the resulting graphene oxide-coated layer.

In this process, graphene oxide gel is prepared by immersing a graphitic material in a powder or fibrous form in an oxidizing liquid to form an optically opaque suspension in a reaction vessel at a reaction temperature for a length of time sufficient to obtain a graphene oxide gel that is optically transparent or translucent, wherein the graphene oxide gel is composed of graphene oxide molecules dispersed in an acidic medium having a pH value of no higher than 5 and said graphene oxide molecules have an oxygen content no less than 20% by weight.

In particular, the graphene oxide gel may be prepared by immersing a graphitic material in an oxidizing agent to form an optically opaque suspension and allowing an oxidizing reaction between the oxidizing agent and the graphitic material to proceed until an optically transparent or translucent solution is formed, and wherein the graphitic material is selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

DESCRIPTION OF THE PREFERRED EMBODIMENTS

The present invention provides a heat dissipation system that contains a graphene oxide-coated graphitic foil laminate to protect an electronic device. This laminate has a unique combination of outstanding in-plane thermal conductivity, in-plane electrical conductivity, mechanical strength, surface hardness and scratch resistance (including reduction or elimination of the tendency for surface graphite flakes or particles to "flake off"). These outstanding properties, alone or in combination, are a surprising result of the unique and synergistic combination of a graphitic core or substrate layer and a graphene oxide-based coating or skin layer.

In particular, the presently invented heat dissipation system comprises: (a) an electronic device comprising a heat source, wherein the heat source transmits heat to a second component or an external surface of the electronic device; (b) a heat-conducting layer comprising two major surfaces, the heat-conducting layer being positioned such that one of its major surfaces is in operative contact with the heat source such that it is interposed between the heat source and the second component or the external surface of the electronic device. The heat-conducting layer comprises at least one graphene oxide-coated graphitic foil laminate which thermally shields the second component or the external surface of the electronic device from heat generated by the heat source.

This GO-coated structure can be a multi-layer structure (2-layer, 3-layer, or a higher number of layers) and is composed of a graphitic substrate (or core) layer having two opposed primary surfaces and at least a graphene oxide coating layer deposited on at least one of the primary surfaces, wherein the graphene oxide coating layer has an oxygen content of 0.01%-40% by weight based on the total graphene oxide weight.

The heat in an electronic device is mainly generated from a CPU, a battery, a lighting device (e.g. LED), etc. The continuous generation of heat must be quickly transferred to other locations or exterior surfaces of the device in order to prevent any head-induced damage to any functional component of the electronic device. In a modern electronic device (e.g., mobile phone, laptop computer, digital camera, tablet, electronic reader, etc), a heat source (CPU or battery) is normally surrounded with several functional components. A heat spreader sheet can be used to rapidly transfer the heat along the sheet plane, which is thermally connected to a heat sink (e.g. heat pipe, a Peltier device, etc) or outside air, thereby effectively dissipating the heat. The presently invented GO-coated graphitic foil laminate provides the best in-plane thermal conductivity to meet this functional requirement.

Figure 2A:
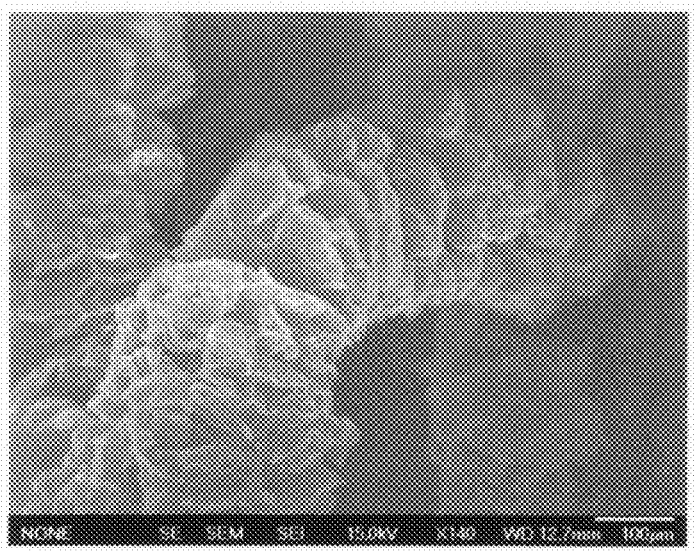
FIG. 2 (a) A SEM image of a graphite worm sample after thermal exfoliation of graphite intercalation compounds (GICs) or graphite oxide powders; (b) An SEM image of a cross-section of a flexible graphite foil, showing many graphite flakes with orientations not parallel to the flexible graphite foil surface and also showing many defects.
Figure 2B:
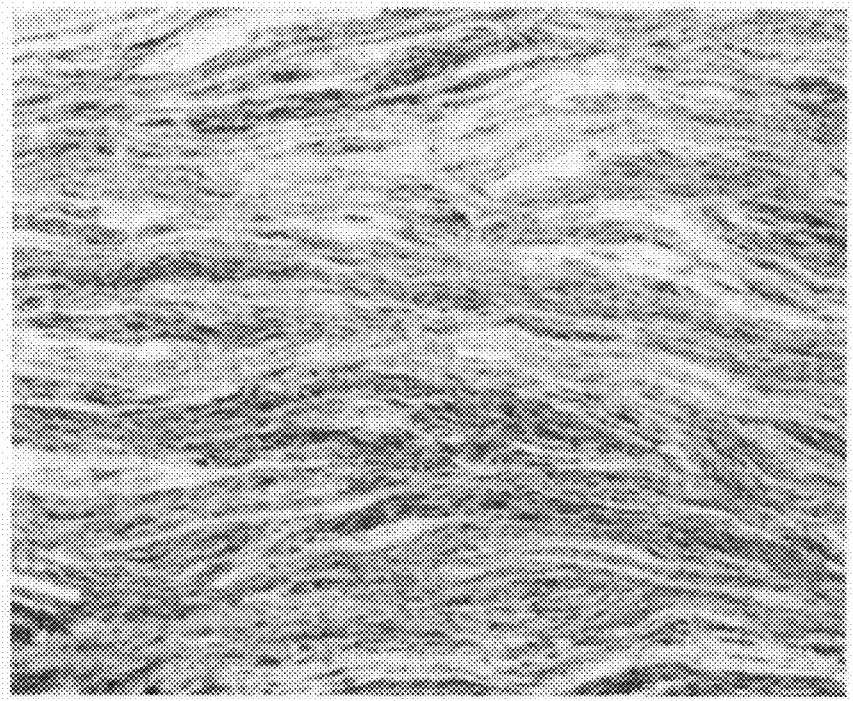

Since several functional components are positioned in the vicinity of a heat source, the heat cannot be allowed to transfer directly through the thickness of a heat spreader to reach these functional components. Hence, it is highly desirable for the heat spreader to have a high in-plane thermal conductivity (e.g. enabling rapid dissipation to the outside air), but a low thickness-direction thermal conductivity (e.g. shielding the functional components against heat penetration through the heat spreader thickness). For meeting this technical requirement, conventional thermally conductive metals (e.g. Cu and Al) are not useful since their thermal conductivity is isotropic, independent of the measurement direction. Flexible graphite foils have some hope since they are relatively anisotropic; however, due to most of the constituent graphite flakes not oriented along the foil plane direction (e.g. FIG. 2(b)), their in-plane thermal conductivity is relatively low (more typically <300 W/mK) and their thickness-direction thermal conductivity is relatively high (typically 10-30 W/mK). In contrast, the in-plane thermal conductivity of our GO-coated graphitic foil laminate typically has an in-plane thermal conductivity in the range of 600-2,000 W/mK (more typically >1,000 W/mK and often significantly >1,700 W/mK) and a thickness-direction thermal conductivity typically lower than 10 W/mK (more typically lower than 5 W/mK, and can be made to go significantly lower than 1 W/mK, if so desired). This is a very surprising and desirable feature.

Thus, a heat spreader in an electronic device must have a high in-plane thermal conductivity and, preferably, also have a low through-plane thermal conductivity. Few, if any, current materials can meet these functional requirements.

The graphene oxide coating of the presently invented coated laminate as a heat spreader layer preferably comprises a unitary graphene layer or a single crystal of graphene planes obtained by heat-treating graphene oxide gel. The graphene planes of hexagonal carbon atoms are parallel to the coating layer plane or one of the primary surfaces of the graphitic foil. The lateral dimensions of the unitary graphene layer or graphene single crystal can be as large as the width of the underlying graphitic core layer (e.g. from tens of microns up to hundreds of centimeters).

The graphitic foil or substrate layer of a coated laminate may contain a material selected from natural graphite, artificial graphite, meso-phase carbon, meso-phase pitch, meso-carbon micro-bead, soft carbon, hard carbon, coke, carbon fiber, carbon nano-fiber (CNF), carbon nano-tube (CNT), or a combination thereof. This graphitic material can be made into thin film, paper, or mat form. For instance, a mass of multiple CNTs may be made into a paper form, commonly referred to as a Bulky paper. A mass of multiple CNFs may be made into a mass or veil with or without a resin binder. The resin binder may be further carbonized to become a carbon binder. Alternatively, a mass of any of the aforementioned carbon/graphite materials, in a particulate or fibrous form, may be bonded by a resin matrix to form a composite. Optionally, the composite can be heat-treated to convert the resin into a carbon matrix, forming a carbon/carbon composite. This graphitic core or substrate can be porous or non-porous.

Graphite is made up of layer planes of hexagonal networks of carbon atoms. These layer planes of hexagonally arranged carbon atoms are substantially flat and are oriented or ordered so as to be substantially parallel and equidistant to one another. These layers of carbon atoms, commonly referred to as graphene layers or basal planes, are weakly bonded together in their thickness direction by weak van der Waals forces and groups of these graphene layers are arranged in crystallites. Highly ordered graphite particles consist of crystallites of considerable size: the crystallites being highly aligned or oriented with respect to each other and having well ordered carbon layers. These anisotropic structures give rise to many properties that are highly directional, such as thermal and electrical conductivity.

The graphite structure is usually characterized in terms of two axes or directions: the "c" axis or direction and the "a" axes or directions. The "c" axis is the direction perpendicular to the basal planes. The "a" axes are the directions parallel to the basal planes (perpendicular to the "c" direction). The graphite suitable for manufacturing flexible graphite sheets is typically natural graphite flakes that possess a high degree of orientation.

Due to the weak van der Waals forces holding the parallel graphene layers, natural graphite can be treated so that the spacing between the graphene layers can be appreciably opened up so as to provide a marked expansion in the "c" direction, and thus form an expanded graphite structure in which the laminar character of the carbon layers is substantially retained. The process for manufacturing flexible graphite is well-known and the typical practice is described in U.S. Pat. No. 3,404,061 to Shane et al., the disclosure of which is incorporated herein by reference. In general, flakes of natural graphite are intercalated in an acid solution to produce graphite intercalation compounds (GICs). The GICs are washed, dried, and then exfoliated by exposure to a high temperature for a short period of time. This causes the flakes to expand or exfoliate in the "c" direction of the graphite up to 80-300 times of their original dimensions. The exfoliated graphite flakes are vermiform in appearance and, hence, are commonly referred to as worms. These worms of graphite flakes which have been greatly expanded can be formed without the use of a binder into cohesive or integrated sheets of expanded graphite, e.g. webs, papers, strips, tapes, foils, mats or the like (typically referred to as "flexible graphite") having a typical density of about 0.04-2.0 g/cm$^3$ for most applications.

Figure 1:
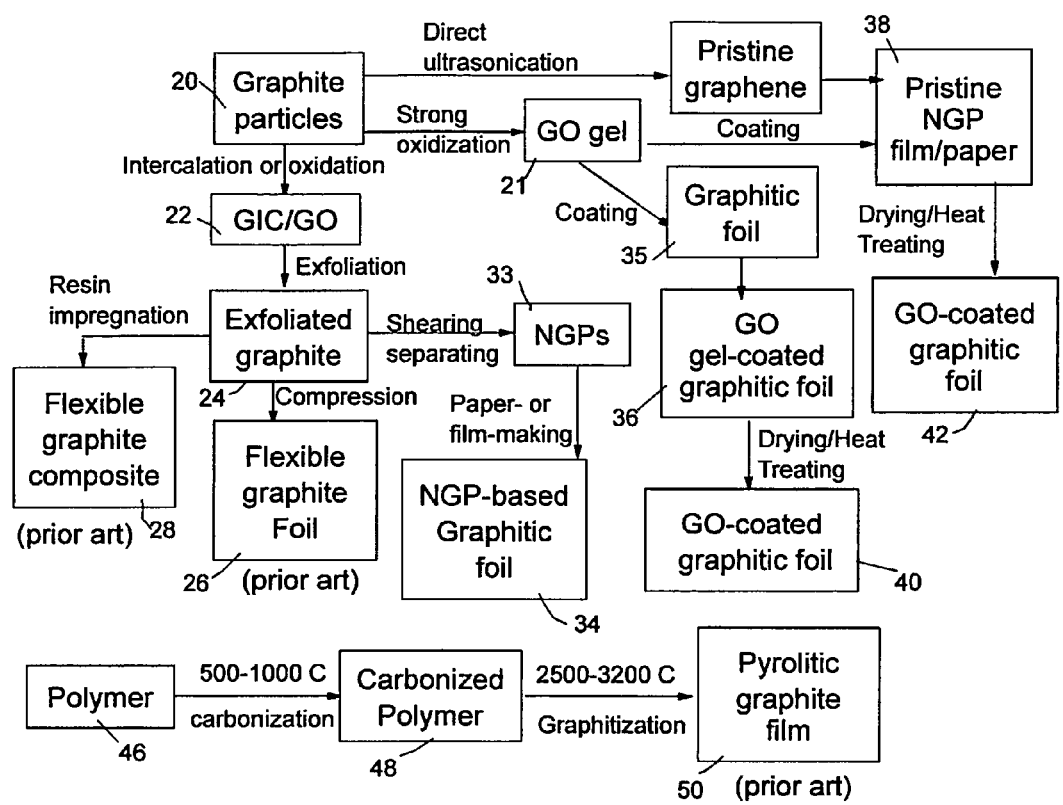
FIG. 1 A flow chart illustrating various prior art processes of producing exfoliated graphite products (flexible graphite foils and flexible graphite composites) and pyrolytic graphite films, along with presently invented processes of producing a graphene oxide gel-coated graphitic core/substrate layer.

The upper left portion of FIG. 1 shows a flow chart that illustrates the prior art processes used to fabricate flexible graphite foil and the resin-impregnated flexible graphite composite. The processes typically begin with intercalating graphite particles 20 (e.g., natural graphite or synthetic graphite flakes) with an intercalant (typically a strong acid or acid mixture) to obtain a graphite intercalation compound 22 (GIC). After rinsing in water to remove excess acid, the GIC becomes "expandable graphite." The GIC or expandable graphite is then exposed to a high temperature environment (e.g., in a tube furnace preset at a temperature in the range of 800-1,050° C.) for a short duration of time (typically from 15 seconds to 2 minutes). This thermal treatment allows the graphite to expand in its "c" direction by a factor of 30 to several hundreds to obtain a worm-like vermicular structure 24 (graphite worm), which contains exfoliated, but unseparated graphite flakes with large pores interposed between these interconnected flakes. An example of graphite worms is presented in FIG. 2(a).

In one prior art process, the exfoliated graphite (or mass of graphite worms) is re-compressed by using a calendering or roll-pressing technique to obtain flexible graphite foils 26, which are typically much thicker than 100 μm. No flexible graphite foil thinner than 75 μm has ever been reported in the open literature or patent documents. An SEM image of a cross-section of a flexible graphite foil is presented in FIG. 2(b), which shows many graphite flakes with orientations not parallel to the flexible graphite foil surface and there are many defects and imperfections.

Largely due to these mis-orientations of graphite flakes and the presence of defects, commercially available flexible graphite foils normally have an in-plane electrical conductivity of 1-3×10$^3$ S/cm, through-plane (thickness-direction or Z-direction) electrical conductivity of 15-30 S/cm, in-plane thermal conductivity of 140-190 W/mK (although some commercial literature claiming thermal conductivity values up to 300 W/mK), and through-plane thermal conductivity of approximately 10-30 W/mK. These defects and mis-orientations are also responsible for the low mechanical strength (e.g. defects are potential stress concentration sites where cracks are preferentially initiated). These properties are inadequate for many thermal management applications and the present invention is made to address these issues.

In another prior art process, the exfoliated graphite worm 24 may be impregnated with a resin and then compressed and cured to form a flexible graphite composite 28, which is normally of low strength as well. In addition, upon resin impregnation, the electrical and thermal conductivity of the graphite worms could be reduced by two orders of magnitude.

The exfoliated graphite may be subjected to high-intensity mechanical shearing/separation treatments using a high-intensity air jet mill, high-intensity ball mill, or ultrasonic device to produce separated nano graphene platelets 33 (NGPs) with all the graphene platelets thinner than 100 nm, mostly thinner than 10 nm, and, in many cases, being single-layer graphene. An NGP is composed of a graphene sheet or a plurality of graphene sheets with each sheet being a two-dimensional, hexagonal structure of carbon atoms.

For the purpose of defining the geometry and orientation of an NGP, the NGP is described as having a length (the largest dimension), a width (the second largest dimension), and a thickness. The thickness is the smallest dimension, which is no greater than 100 nm, preferably smaller than 10 nm in the present application. When the platelet is approximately circular in shape, the length and width are referred to as diameter. In the presently defined NGPs, both the length and width can be smaller than 1 μm, but can be larger than 200 μm.

A mass of multiple NGPs (including single-layer and/or few-layer graphene sheets, 33 in FIG. 1) may be made into a graphene film/paper (34 in FIG. 1) using a film- or paper-making process. This graphene film or paper can be used as a graphitic core or substrate layer of the presently invented graphene oxide-coated laminate. FIG. 3(b) shows a SEM image of a cross-section of a graphene paper/film prepared from relatively wide discrete graphene sheets using a paper-making process. The image shows many discrete graphene sheets being folded or interrupted (not integrated), with orientations not parallel to the film/paper surface and having many defects or imperfections. NGP aggregates, even when being closely packed, exhibit a thermal conductivity higher than 1,000 W/mK only when the film or paper is cast and pressed into a sheet having a thickness lower than 10 μm, and higher than 1,500 W/mK only when the film or paper is cast and pressed into a sheet having a thickness lower than 1 μm. A heat spreader in many electronic devices is normally required to be thicker than 25 μm and, more desirably, thicker than 50 μm (but no greater than 200 μm).

In addition to a graphitic foil as the substrate or core layer, another ingredient of the presently invented "GO-coated laminate" is graphene oxide (GO) coating, which is obtained from a graphene oxide gel. This gel is obtained by immersing a graphitic material 20 in a powder or fibrous form in a strong oxidizing liquid in a reaction vessel to form a suspension or slurry, which initially is optically opaque. This optical opacity reflects the fact that, at the outset of the oxidizing reaction, the discrete graphite flakes and, at a later stage, the discrete graphene oxide flakes scatter visible wavelengths, resulting in an opaque and generally dark fluid mass. If the reaction between graphite powder and the oxidizing agent is allowed to proceed at a sufficiently high reaction temperature for a sufficient length of time, this opaque suspension is transformed into a translucent or transparent solution, which is now a homogeneous fluid called "graphene oxide gel" (21 in FIG. 1) that contains no discernible discrete graphite flakes or graphite oxide platelets. In other words, this graphene oxide gel is optically transparent or translucent and visually homogeneous with no discernible discrete flakes/platelets of graphite, graphene, or graphene oxide dispersed therein. In contrast, conventional suspension of discrete graphene sheets, graphene oxide sheets, and expanded graphite flakes look dark, black or heavy brown in color with individual graphene or graphene oxide sheets or expanded graphite flakes discernible or recognizable with naked eyes.

The graphene oxide molecules dissolved in the liquid medium of a graphene oxide gel are aromatic chains that have an average number of benzene rings in the chain typically less than 1,000, more typically less than 500, and many less than 100. Most of the molecules have more than 5 or 6 benzene rings (mostly >10 benzene rings) from combined atomic force microscopy, high-resolution TEM, and molecular weight measurements. Based on our elemental analysis, these benzene-ring type of aromatic molecules are heavily oxidized, containing a high concentration of functional groups, such as —COOH and —OH and, therefore, are "soluble" (not just dispersible) in polar solvents, such as water. The estimated molecular weight of these graphene oxide polymers in the gel state is typically between 200 g/mole and 43,000 g/mole, more typically between 400 g/mole and 21,500 g/mole, and most typically between 400 g/mole and 4,000 g/mole.

These soluble molecules behave like polymers and are surprisingly capable of serving as a coating material that can strongly adhere to a graphitic core/substrate foil to form a laminate of good structural integrity and high thermal conductivity. Conventional discrete graphene or graphene oxide sheets or platelets do not have any adhesion power.

Figure 3A:
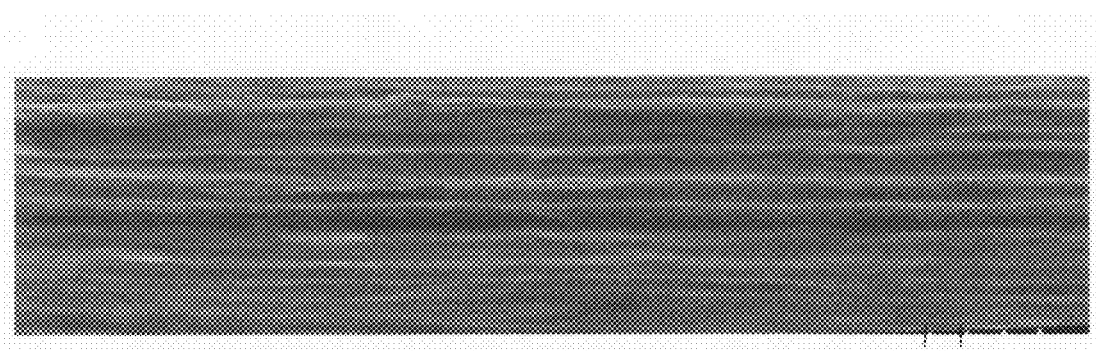
FIG. 3 (a) A SEM image of a GO coating layer cross-section wherein multiple graphene sheets, originally 30 nm-2 μm in lateral dimension, have been seamlessly merged into continuous-length graphene sheets or layers that can run for hundreds of centimeters wide or long (only a 120 μm or 0.12 mm width of a 25-cm wide coating being shown in this SEM image); (b) A SEM image of a cross-section of a graphene paper/film (for use as a core or substrate layer) prepared from relatively wide discrete graphene sheets using a paper-making process (e.g. vacuum-assisted filtration). The image shows many discrete graphene sheets being folded or interrupted (not integrated), with orientations not parallel to the film/paper surface and having many defects or imperfections; (c) Schematic drawing and an attendant SEM image to illustrate the formation process of a graphene single crystal that is composed of multiple graphene planes parallel to one another.
Figure 3B:
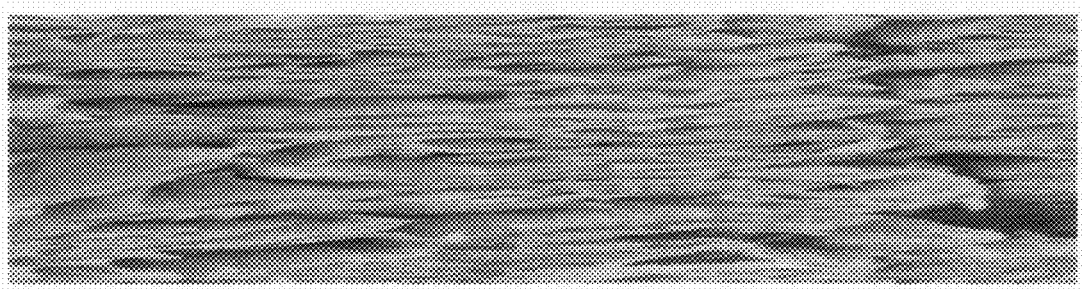
Figure 3C:
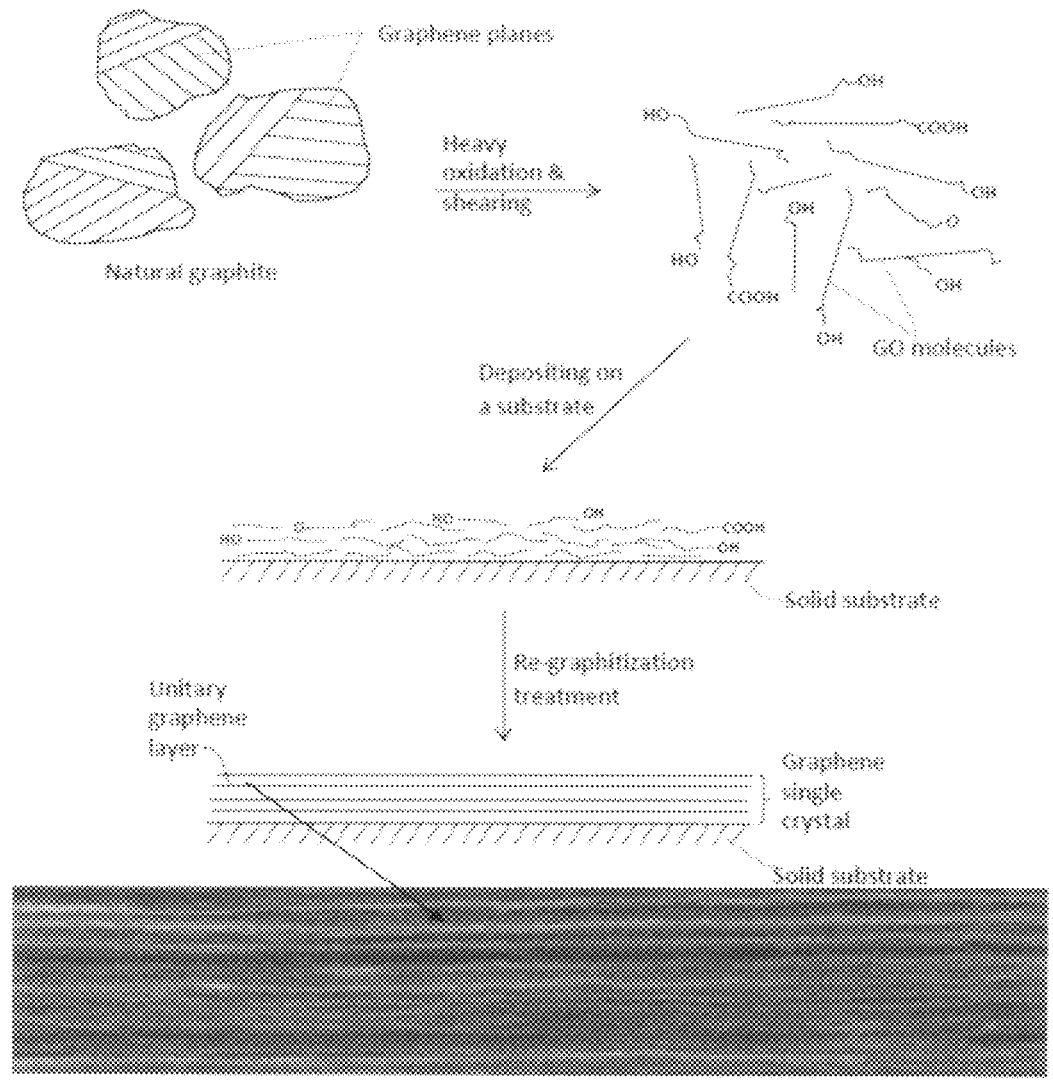

Most significantly, these graphene oxide molecules present in a GO gel state are capable of merging with one another and getting integrated into extremely long and wide graphene layers (e.g. FIG. 3(a)) when the gel is dried and heat-treated at a sufficiently high temperature for a sufficiently long period of time. These individual layers, each being a unitary entity, can run as wide as the specimen width itself (up to hundreds of centimeters) that are parallel to one another. No individual graphene platelets or sheets are discernible; they simply have been fully linked and integrated with one another to form a layer-like unitary body. These unitary bodies appear to stack with one another along the thickness-direction (or Z-direction). X-ray diffraction studies have confirmed that the d-spacing (inter-graphene plane distance) has been recovered back to approximately 0.335 nm. There does not appear to be any gap between these unitary layers and, hence, these unitary layers have been essentially merged into one big unitary body, which is a graphene single crystal. FIG. 3(a) depicts an example of such a huge unitary body. Although there appears to be some demarcations between unitary layers, these perceived demarcations are due to slightly different lengths between unitary layers. They actually have formed a single integrated entity or single crystal.

The present invention provides a graphene oxide-coated graphitic foil, which is a 2-layer, 3-layer, or n-layer laminate (n=any integer, but typically n<100, more typically, n<10, and most typically n<6). The graphitic core or substrate layer has two primary surfaces on the opposite sides of the layer. If one of the primary surfaces is coated with a layer of GO, we have a 2-layer laminate. If both primary surfaces are coated with GO, we have a 3-layer laminate. One may further deposit a layer of protective material on a GO coating layer to make a 4-layer laminate, for instance. This protective layer can be an electrically insulating resin layer for certain applications, e.g. for transferring heat from a CPU of a mobile phone or laptop computer to the GO coating layer so that the GO coating can help dissipate the heat generated by the CPU. The electrically insulating layer is essential to preventing internal shorting. Further optionally, another layer of material (e.g. a thermal interface material) can be deposited onto the opposite side of this 4-layer laminate to make a 5-layer structure.

The coated laminate preferably has a thickness no greater than 1 mm, further preferably less than 200 μm, and most preferably less than 100 μm. More preferably, the thickness is greater than 10 μm, further preferably between 10 and 100 μm, and most preferably between 10 μm and 50 μm. A thickness less than 10 μm would make it difficult to handle the laminate when attempting to incorporate pieces of the laminate in a device for thermal management applications (e.g. as a heat spreader in a microelectronic device).

In a special case of using graphene-based graphitic core layer, the constituent graphene sheets (NGPs) preferably contain multi-layer graphene sheets preferably having a thickness of 3.35 nm to 33.5 nm. Preferably, the resulting graphitic core layer has a thickness no greater than 100 μm, more preferably less than 50 μm. When multi-layer graphene sheets have a thickness of 6.7 nm to 20 nm, one can readily produce a graphitic core layer having an exceptional thermal conductivity.

The graphene-based graphitic core layer desirably contains pristine graphene containing no oxygen. The pristine graphene can be obtained from direct ultrasonication without involving oxidation of a graphitic material. As shown in the upper portion of FIG. 1, pristine graphite particles 20 (without exposing to the oxidizing or other chemical treatment) may be directly exposed to high-intensity ultrasonication to produce pristine graphene sheets. Multiple pristine graphene sheets may then be aggregated together to form a graphene paper/film 38 via a paper-making procedure, for instance. The pristine graphene paper/film, as a graphitic core foil, is then coated with one or two layers of GO gel to obtain GO-coated laminate 42.

The GO coating material, when in a gel state, typically has an oxygen content of 20-46% by weight. After being deposited onto a primary surface of a graphitic core layer to form a laminate, the subsequent heat treatment process naturally reduces the oxygen content to typically 0.01-10% by weight, more typically 0.01%-5%.

The graphene oxide is obtained from a graphene oxide gel, which gel is composed of graphene oxide molecules dispersed in an acidic medium having a pH value of no higher than 5 and the graphene oxide molecules have an oxygen content no less than 20% by weight. In particular, the gel is obtained by immersing a graphitic material in a powder or fibrous form in an oxidizing liquid in a reaction vessel at a reaction temperature for a length of time sufficient to obtain a graphene oxide gel composed of graphene oxide molecules dispersed in an acidic liquid medium having a pH value of no higher than 5 and the graphene oxide molecules have an oxygen content no less than 20% by weight. As indicated in FIG. 1, the graphene oxide coated laminate is formed by depositing a layer of graphene oxide gel 21 to one or both primary surfaces of a graphitic core layer 35 to form a GO gel-coated graphitic foil 36. By removing the residual liquid from the gel in the GO gel coating layer and subjecting the GO gel-coated laminate to a heat treatment we obtain the desired GO-coated graphitic foil laminate 40.

The starting graphitic material for the purpose of forming graphene oxide gel may be selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. The graphitic material is preferably in a powder or short filament form having a dimension lower than 20 μm, more preferably lower than 10 μm, further preferably smaller than 5 μm, and most preferably smaller than 1 μm.

Using artificial graphite with an average particle size of 9.7 μm as an example, a typical procedure involves dispersing graphite particles in an oxidizer mixture of sulfuric acid, nitric acid, and potassium permanganate (at a weight ratio of 3:1:0.05) at a temperature of typically 0-60° C. for typically at least 3 days, preferably 5 days, and more preferably 7 days or longer. The average molecular weight of the resulting graphene oxide molecules in a gel is approximately 20,000-40,000 g/mole if the treatment time is 3 days, <10,000 g/mole if 5 days, and <4,000 g/mole if longer than 7 days. The required gel formation time is dependent upon the particle size of the original graphitic material, a smaller size requiring a shorter time. It is of fundamental significance to note that if the critical gel formation time is not reached, the suspension of graphite powder and oxidizer (graphite particles dispersed in the oxidizer liquid) appears completely opaque, meaning that discrete graphite particles or flakes remain suspended (but not dissolved) in the liquid medium. As soon as this critical time is exceeded, the whole suspension becomes optically translucent or transparent, meaning that the heavily oxidized graphite completely loses its original graphite identity and the resulting graphene oxide molecules are completely dissolved in the oxidizer liquid, forming a homogeneous solution (no longer just a suspension or slurry).

It must be further noted that if the suspension or slurry, with a treatment time being shorter than the required gel formation time, is rinsed and dried, we would simply recover a graphite oxide powder or graphite intercalation compound (GIC) powder, which can be exfoliated and separated to produce nano graphene platelets (NGPs). Without an adequate amount of a strong oxidizing agent and an adequate duration of oxidation time, the graphite or graphite oxide particles would not be converted into the gel state.

Hence, the NGPs (for use in a graphitic core layer) may be produced by subjecting a graphitic material to a combined treatment of oxidation, exfoliation, and separation. This graphitic material may also be selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof. The NGPs can also be produced from a process such as (a) direct ultrasonication, (b) potassium melt intercalation and water/alcohol-induced exfoliation, or (c) supercritical fluid intercalation/exfoliation/separation of non-oxidized graphitic material. These processes produce pristine graphene that contains no oxygen.

The graphene oxide-coated laminate of the present invention typically has an in-plane thermal conductivity greater than 800 W/mK, more typically greater than 1,000 W/mK (even when the film thickness is greater than 10 μm) and often greater than 1,700 W/mK. This latter valve. is typically obtained when the graphitic core layer is relatively thin compared to the GO coating layers and when the final heat treatment temperature is higher than 2,500° C. The coated laminate typically has an in-plane electrical conductivity greater than 3,000 S/cm (even >10,000 S/cm). This high in-plane electrical conductivity (greater than 3000 S/cm and up to 20,000 S/cm) can be achieved concurrently with an in-plane thermal conductivity greater than 1,000 W/mK (up to 1,900 W/mK). Quite often, the GO-coated laminate can exhibit a combination of a high in-plane electrical conductivity (greater than 1,500 S/cm), a high in-plane thermal conductivity (greater than 600 W/mK), a relatively high physical density (greater than 1.4 g/cm$^3$), and a relatively high tensile strength (greater than 10 MPa, often >40 MPa, and can be >120 MPa). The high in-plane thermal conductivity is achieved with a low through-plane (thickness-direction) thermal conductivity (typically lower than 10 W/mK and more typically lower than 5 W/mK), which is a desirable feature for using the laminate as an in-plane heat dissipating member and through-plane heat-shielding member.

The GO-coated laminates also exhibit an exceptional surface hardness and scratch resistance, eliminating the tendency for a graphitic core foil (particularly flexible graphite foil and recompressed graphene platelet foil) to flake off (to emit free carbon or graphite particles into air).

Quite surprisingly, in many samples, the GO-coated laminate has an in-plane electrical conductivity greater than 2,000 S/cm, an in-plane thermal conductivity greater than 800 W/mK, a physical density greater than 1.8 g/cm$^3$, and a tensile strength greater than 40 MPa. This combination of superior properties has not been achieved with any graphite or non-graphite material. In some cases, the coated laminate exhibits an in-plane electrical conductivity greater than 3,000 S/cm (up to 20,000 S/cm), an in-plane thermal conductivity greater than 1,500 W/mK (up to 1,900 W/mK), a physical density greater than 2.0 g/cm$^3$, and a tensile strength greater than 40 MPa (up to 120 MPa). This type of graphene oxide-coated laminate may be used as a heat spreader component in a portable device.

The present invention also provides a process for producing a graphene oxide-coated graphitic core/substrate laminate for use as a heat dissipating layer in an electronic device. The process comprises (a) preparing a core or substrate layer of a graphitic material; (b) preparing a graphene oxide gel having graphene oxide molecules dispersed in a fluid medium, wherein the graphene oxide gel is optically transparent or translucent; (c) depositing graphene oxide gel onto a surface of the core or substrate layer to form a coating thereon; and (d) removing the fluid medium from the coating. This is preferably followed by a step of heat-treating the resulting graphene oxide-coated layer laminate. The process preferably comprises a further step of compressing the graphene oxide-coated graphitic foil (e.g. using a roll-press).

Step (a) of preparing a core or substrate layer of a graphitic material preferably includes feeding a sheet of a graphitic material from a roller to a coating zone, and the process comprises a step of depositing graphene oxide gel onto a surface of the sheet of a graphitic material to form a graphene oxide gel-coated sheet and further comprises collecting the coated sheet on a collector roller. This roll-to-roll process may be conducted in an intermittent or continuous manner.

The graphene oxide gel is then deposited onto a primary surface of a graphitic core layer using any coating, casting, spraying, or liquid-dispensing process. Upon removal of the liquid medium from the coating layer, the resulting coated laminate is then subjected to a thermal treatment or re-graphitization treatment (typically 100-1000° C., but can be higher), which allows individual graphene oxide molecules to chemically bond to one another. This thermal treatment surprisingly enables or activates the re-joining, polymerization, or chain-growth of otherwise small graphene oxide molecules, resulting in removal of non-carbon elements (e.g. H and O) and formation of huge graphene sheets. It appears that the graphene oxide molecules can be merged and integrated into several unitary graphene layers that run parallel to one another and these graphene layers can cover the entire length of the coating layer without interruption. In other words, these graphene layers are each a complete unitary graphene entity. These complete unitary graphene layers actually constitute one unitary entity that is essentially a graphene block with all graphene planes being oriented along one single direction (e.g. FIG. 3(a)). This unitary body (or "single crystal") of highly oriented graphene planes exhibits an unprecedented combination of exceptional thermal conductivity, electrical conductivity, structural integrity (strength and ease of handling). These properties are unmatched by any graphitic or non-graphitic material.

The thermal treatment process can be assisted with a calendering or roll-pressing operation to help improve the surface finish of the resulting coated laminate. The laminate thickness can be less than 10 μm, but preferably between 10 μm and 200 and most preferably between 20 μm and 100 μm.

As indicated above, flexible graphite foils prepared by re-compression of exfoliated graphite flakes or graphite worms exhibit relatively low thermal conductivity and mechanical strength. The graphite worms can be formed into flexible graphite foils by compression, without the use of any binding material, presumably due to the mechanical interlocking between the voluminously expanded graphite flakes. Although a significant proportion of these flakes are oriented in a direction largely parallel to the opposing surfaces of a flexible graphite sheet (as evidenced by the high degree of anisotropy with respect to thermal and electrical conductivity), many other flakes are distorted, kinked, bent over, or oriented in a direction non-parallel to these sheet surfaces (FIG. 2(B)). This observation has been well demonstrated in many scanning electron micrographs (SEM) published in open or patent literature. Furthermore, the presence of a large number of graphite flakes implies a large amount of interface between flakes, resulting in very high contact resistance (both thermal and electrical resistance).

As a consequence, the in-plane electrical or thermal conductivity of the resulting flexible graphite foils dramatically deviates from what would be expected of a perfect graphite single crystal or a graphene layer. For instance, the theoretical in-plane electrical conductivity and thermal conductivity of a graphene layer are predicted to be $1-5 \times 10^4$ S/cm and 3,000-5,000 W/(mK), respectively. However, the actual corresponding values for flexible graphite foils are $1-3 \times 10^3$ S/cm and 140-300 W/(mK), respectively; one order of magnitude lower than what could be achieved. By contrast, the corresponding values for the presently invented graphene oxide-coated graphitic foil are approximately $3.5-20 \times 10^3$ S/cm (3,500-20,000 S/cm) and 600-2,000 W/(mK), respectively.

The present invention also provides a highly thermally conductive GO-coated laminate that can be used for thermal management applications; e.g. for use as a heat spreader in a microelectronic device (such as mobile phone, notebook computer, e-book, and tablet), flexible display, light-emitting diode (LED), power tool, computer CPU, and power electronics. We are filing separate patent applications to claim the various products or applications of the presently invented GO-coated graphitic laminates.

Example 1: Preparation of Nano Graphene Platelets (NGPs)

Chopped graphite fibers with an average diameter of 12 μm was used as a starting material, which was immersed in a mixture of concentrated sulfuric acid, nitric acid, and potassium permanganate (as the chemical intercalate and oxidizer) to prepare graphite intercalation compounds (GICs). The fiber segments were first dried in a vacuum oven for 24 h at 80° C. Then, a mixture of concentrated sulfuric acid, fuming nitric acid, and potassium permanganate (at a weight ratio of 4:1:0.05) was slowly added, under appropriate cooling and stirring, to a three-neck flask containing fiber segments. After 16 hours of reaction, the acid-treated graphite fibers were filtered and washed thoroughly with deionized water until the pH level of the solution reached 6. After being dried at 100° C. overnight, the resulting graphite intercalation compound (GIC) was subjected to a thermal shock at 1050° C. for 45 seconds in a tube furnace to form exfoliated graphite (worms). Five grams of the resulting exfoliated graphite (EG) were mixed with 2,000 ml alcohol solution consisting of alcohol and distilled water with a ratio of 65:35 for 12 hours to obtain a suspension. Then the mixture or suspension was subjected to ultrasonic irradiation with a power of 200 W for various times. After two hours of sonication, EG particles were effectively fragmented into thin NGPs. The suspension was then filtered and dried at 80° C. to remove residue solvents. The as-prepared NGPs have an average thickness of approximately 9.7 nm.

Example 2: Preparation of Single-Layer Graphene from Meso-Carbon Micro-Beads (MCMBs)

Meso-carbon microbeads (MCMBs) were supplied from China Steel Chemical Co. This material has a density of about 2.24 g/cm$^3$ with a median particle size of about 16 μm. MCMB (10 grams) were intercalated with an acid solution (sulfuric acid, nitric acid, and potassium permanganate at a ratio of 4:1:0.05) for 72 hours. Upon completion of the reaction, the mixture was poured into deionized water and filtered. The intercalated MCMBs were repeatedly washed in a 5% solution of HCl to remove most of the sulphate ions. The sample was then washed repeatedly with deionized water until the pH of the filtrate was neutral. The slurry was dried and stored in a vacuum oven at 60° C. for 24 hours. The dried powder sample was placed in a quartz tube and inserted into a horizontal tube furnace pre-set at a desired temperature, 1,080° C. for 45 seconds to obtain a graphene material. TEM and atomic force microscopic studies indicate that most of the NGPs were single-layer graphene.

Example 3: Preparation of Pristine Graphene

In a typical procedure, five grams of graphite flakes, ground to approximately 20 μm or less in sizes, were dispersed in 1,000 mL of deionized water (containing 0.1% by weight of a dispersing agent, Zonyl® FSO from DuPont) to obtain a suspension. An ultrasonic energy level of 85 W (Branson S450 Ultrasonicator) was used for exfoliation, separation, and size reduction of graphene sheets for a period of 15 minutes to 2 hours.

Example 4: Preparation of Graphene Oxide (GO) Gel

Graphite oxide gel was prepared by oxidation of graphite flakes with an oxidizer liquid consisting of sulfuric acid, sodium nitrate, and potassium permanganate at a ratio of 4:1:0.05 at 30° C. When natural graphite flakes (particle sizes of 14 µm) were immersed and dispersed in the oxidizer mixture liquid, the suspension or slurry appears optically opaque and dark. The suspension remains opaque during the first 52 hours of reaction. However, the suspension gradually turns optically translucent (a little cloudy) when the reaction time exceeds 52 hours, and the color of the suspension changes from black to dark brown. After 96 hours, the suspension suddenly becomes an optically transparent solution with light brown color. The solution appears very uniform in color and transparency, indicating the absence of any dispersed discrete objects. The whole solution behaves like a gel, very similar to a typical polymer gel.

Surprisingly, by casting this gel on a glass surface and removing the liquid medium from the cast film we obtain a thin film of graphene oxide that is optically transparent. This thin film looks like and behaves like a regular polymer film. However, upon re-graphitization at a temperature (typically >100° C., more typically >1,000° C., further typically >1,500° C., and can be >2,500° C.) for typically 1-3 hours, this GO film is transformed in a unitary graphene entity comprising or being a large-size graphene single crystal.

By casting a layer of GO gel onto a graphitic material foil (paper, film, mat, etc) and removing the liquid content from the gel, the resulting solid coating layer sticks to the graphitic foil very well. Actually, the bonding between the GO coating and the graphitic foil is very strong and, after a heat treatment, the GO layer cannot be peeled off from the graphitic foil without tearing apart or removing some graphitic foil material. This implies that GO gel, upon re-graphitization, possesses an exceptional cohesive strength. This is a very surprising observation.

Examples 5: Preparation and Testing of Graphene Oxide-Coated Graphitic Foils

The NGPs prepared in Examples 1-3 were made into thin paper or film form (e.g., using a vacuum-assisted filtration technique) for use as a graphitic foil. Other graphitic foils investigated include carbon nano-tube paper (Bucky paper from Buckeye Composites, Inc., Dayton, Ohio), carbon nano-fiber mat (CNFs supplied from Applied Sciences, Inc., Cedarville, Ohio), flexible graphite foils of several different thicknesses (supplied from Graftech and Timcal Graphite), graphite-epoxy composite films prepared in-house, carbon-carbon composite layer prepared in-house (carbon fiber mat reinforced with phenolic resin, which was then carbonized), and carbon paper (Toray). We have also prepared CNT and graphene films that are nanometers in thickness. These nano-thin films were deposited on a plastic film first (PET film, polyethylene terephthalate). PET film serves as an electrically insulating layer to electrically isolate the heat spreader layer from a CPU of a mobile phone or laptop computer.

The graphene oxide gel prepared in Example 4 was used for the preparation of graphene oxide coating. In some cases, discrete NGPs were added into the GO gel to form a mixture gel or NGP-GO gel slurry. In these cases, fully separated NGP platelets were dispersed in graphene oxide gel to produce a graphene platelet gel with the platelet concentration of approximately 1-50% by weight (preferably 5-20% by weight NGP). Ultrasonic waves were employed to assist in the dispersion of NGPs in the gel.

Pure GO gel or NGP-GO mixture gel or slurry was then cast onto a primary surface or both primary surfaces of a graphitic foil using a coating machine equipped with drying and heating provisions. In some cases, the GO gel or NGP-GO gel mixture was casted onto a substrate and regulated by a doctor's blade to form a uniform coating thereon. The liquid in the coating was further removed in a vacuum oven to form a solid GO coating. The resulting coated graphitic foils (also referred to as coated laminates) were then subjected to a heat treatment at a temperature of from 100° C., up to approximately 3,000° C. We have utilized several temperature regimes: 100° C.-1,000° C.; 1,000° C.-1,500° C.; 1,500° C.-2,500° C.; and 2,500° C.-3,000° C.

For comparison, we also carbonized polyimide films at 500° C. for 1 hour and at 1,000° C. for 3 hours in an inert atmosphere and then graphitized the films at a temperature in the range of 2,500-3,000° C. for 1 to 5 hours to form a conventional graphitic film, pyrolytic graphite (PG). Flexible graphite foils were also obtained from commercial sources as another baseline material.

Examples 6: Electrical and Thermal Conductivity Measurements of Various Graphene Oxide-Coated Graphitic Foils Four-point probe tests were conducted on GO-coated graphitic foils (e.g. flexible graphite foil, FG), the GO films alone (coated on a glass surface and then peeled off and heat treated), and the FG foils alone (no coating) to measure their in-plane electrical conductivity. Their in-plane thermal conductivity was measured using a laser flash method (Netzsch Thermal Diffusivity Device).

Figure 4A:
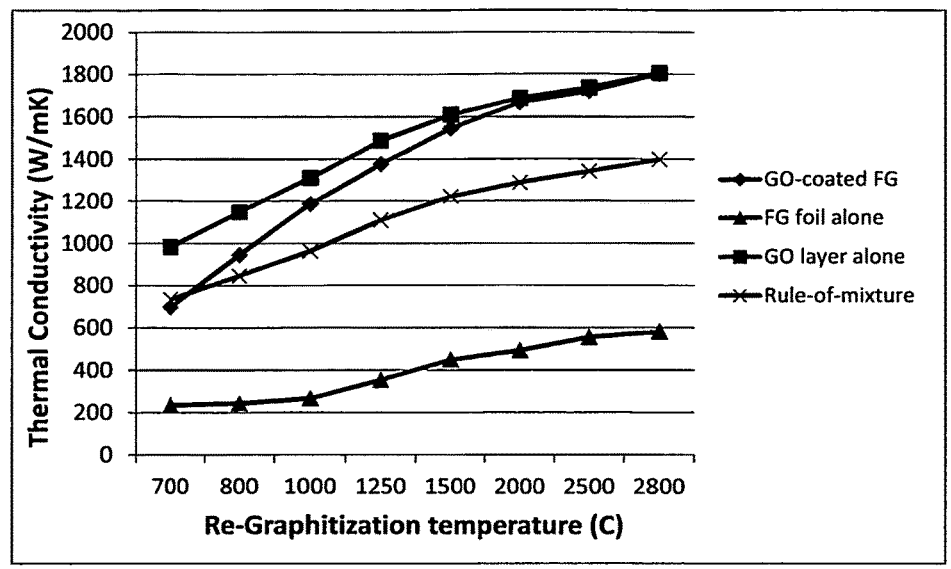
FIG. 4 (a) Thermal conductivity values of the GO layer alone (■), GO-coated flexible graphite (FG) foil (♦), and FG foil alone (▲) plotted as a function of the final graphitization or re-graphitization temperature, along with theoretically predicted values (x) based on a rule-of-mixture law (graphitization time=1 hour for all specimens); (b) Thermal conductivity values of the GO layer alone (■), GO-coated flexible graphite (FG) foil (♦), and polyimide-derived pyrolytic graphite (PG) plotted as a function of the final graphitization or re-graphitization temperature for one hour, along with those of PG graphitized for 3 hours; (c) Electrical conductivity values of the GO layer alone (♦), GO-coated flexible graphite (FG) foil (▲), and FG foil alone (x) plotted as a function of the final graphitization or re-graphitization temperature, along with theoretically predicted values (■) based on a rule-of-mixture law. Note: symbol designations varied from (a) to (c).

The in-plane thermal and electrical conductivities and tensile properties of various films or laminates were investigated. Several significant observations can be made from the testing results (e.g. as summarized in FIGS. 4(a), (b), and (c):

(1) With a thickness of approximately 75 µm, the thermal conductivity of the flexible graphite foil alone (FG, ▲ in FIG. 4(a)) is less than 237 W/mK if the FG foil is not heat-treated at or above 700° C. As the post-recompression heat treatment temperature increases from 700° C. to 2,800° C. (for one hour of graphitization treatment in each case), the thermal conductivity of the FG foil increases from 237 to 582 W/mK, indicating some but limited re-organization of the graphitic structure induced by the heat treatment. By contrast, the thermal conductivity of the GO layer alone (obtained by depositing a layer of GO gel on a glass surface, removing the liquid from the GO layer in vacuum for 1 hour, and peeling off the dried solid GO layer from the glass surface) increases from 983 to 1,807 W/mK (■ in FIG. 4(a)). This indicates a significant or dramatic re-organization of the graphitic structure induced by the heat treatment, with all GO molecules linked or merged edge-to-edge into unitary graphene layers and integrated into a unitary entity of fully and orderly bonded graphene planes, a graphene single crystal.

(2) The thermal conductivity of a corresponding series of GO-coated FG foils (♦ in FIG. 4(a)) increases from 698 to 1,803 W/mK. This is significantly higher than the thermal conductivity values of what would be theoretically predicted (x in FIG. 4(a)) from a rule-of-mixture law, which is commonly used to predict composite properties from constituent properties. Each coating layer is approximately 75 μm thick. These data have clearly demonstrated an un-expected, synergistic effect between GO coating (derived from graphene oxide gel) and the FG foil core layer.

Figure 4B:
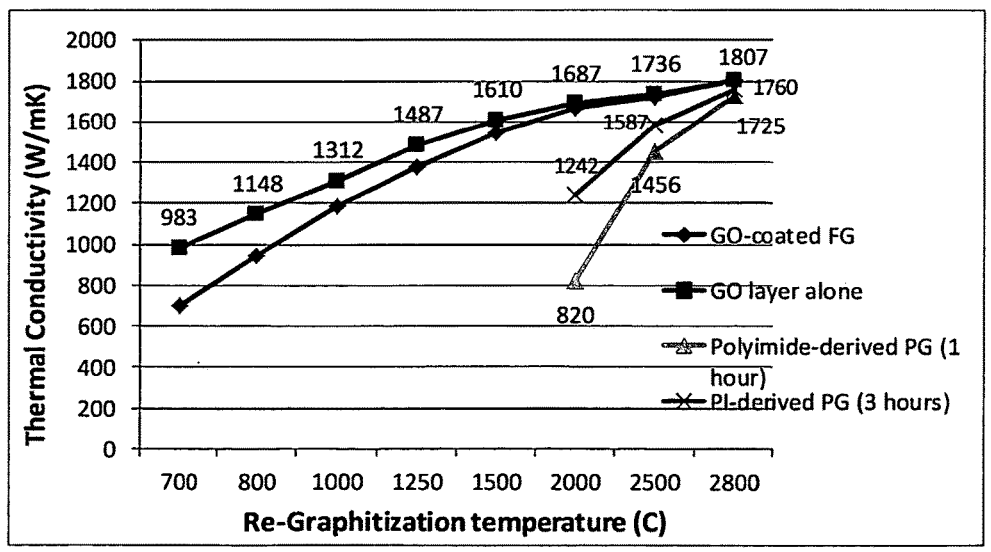

(3) FIG. 4(b) shows that the conventional pyrolytic graphite (PG), produced by carbonizing polyimide and then graphitizing the carbonized PI, exhibits a consistently lower thermal conductivity as compared to the GO layer alone (■) or GO-coated FG laminate (♦), given the same heat treatment (graphitization or re-graphitization) temperature for the same length of heat treatment time. For instance, the PG from PI exhibits a thermal conductivity of 820 W/mK after a graphitization treatment at 2,000° C. for one hour and 1,242 W/mK at 2,000° C. for 3 hours. These observations have demonstrated a clear and significant advantage of using the GO gel approach versus the conventional PG approach. As a matter of fact, no matter how long the graphitization time is for the PG, the thermal conductivity is always lower than that of a GO gel-derived GO or GO-coated FG laminate. In other words, both the GO and GO-coated graphitic foils are fundamentally different and patently distinct from the pyrolytic graphite in terms of chemical composition, structure, morphology, process of production, and properties.

Figure 4C:
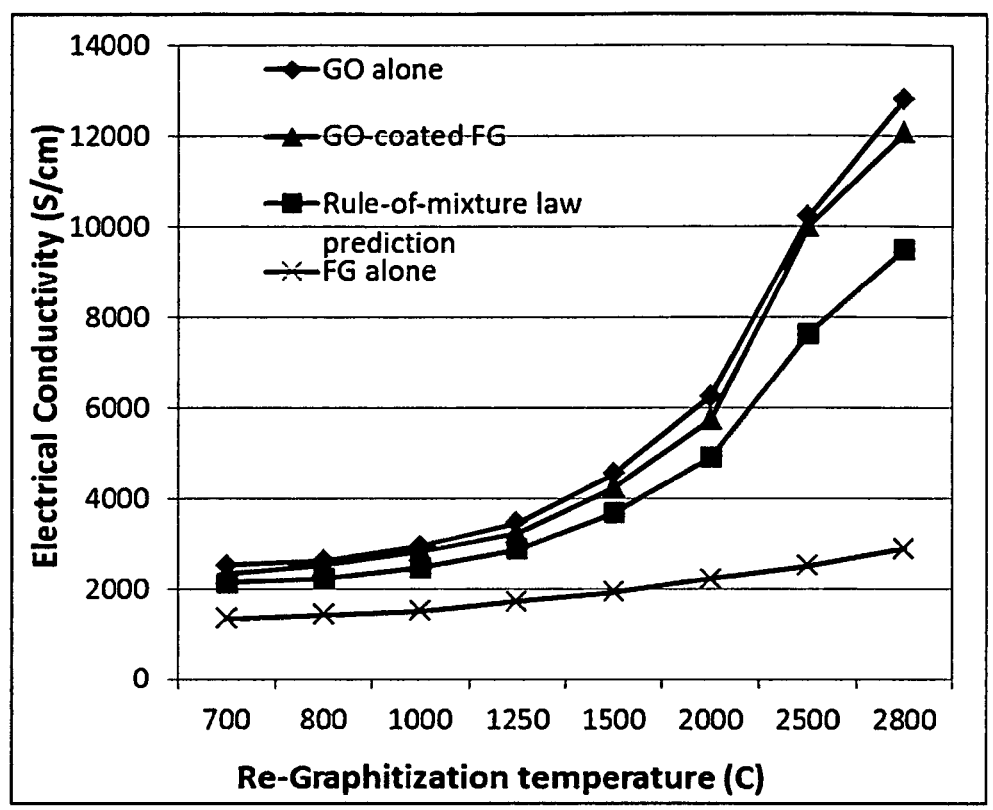

(4) FIG. 4(c) also shows a dramatic synergistic effect in electrical conductivity when GO gel is coated to the surfaces of a FG foil to form a GO-coated laminate. All the electric conductivity values of GO-coated laminates are significantly higher than those predicted by the rule-of-mixture law.

Examples 7: Tensile Strength of Various Graphene Oxide-Coated Graphitic Foils

A series of GO-coated FG foils were prepared with the coating thickness varying from approximately 10 μm to 80 μm per coating layer. The core FG foil is approximately 100 μm thick. A universal testing machine was used to determine the tensile strength of various coated laminates and their uncoated counterparts (core layer only).

Figure 5A:
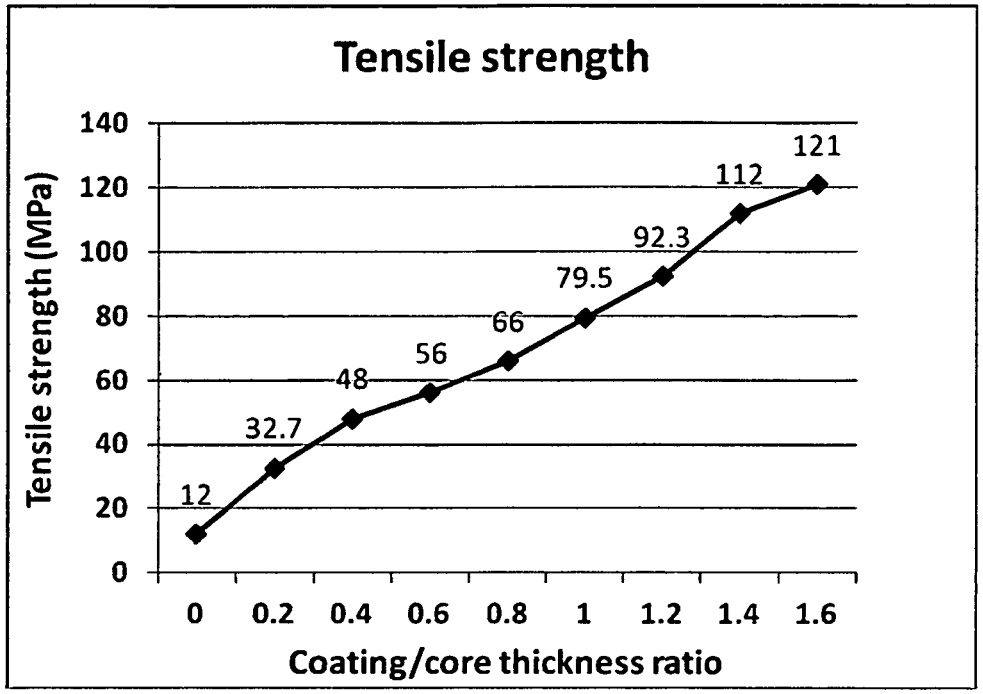
FIG. 5 (a) Tensile strength, (b) scratch visibility, (c) scratch depth, and (d) Rockwell hardness of a series of GO-coated FG foils plotted as a function of the coating-to-core layer thickness ratio.

The tensile strength values are plotted as a function of the coating-to-core thickness ratio, FIG. 5(a). The data have demonstrated that the tensile strength of the flexible graphite foil increases monotonically with respect to the GO coating thickness. (The effect of the specimen thickness increases, due to the deposition of GO layers, has been taken into account by dividing the specimen breaking force by the actual specimen cross-sectional area.) A ten-fold increase in tensile strength, from 12 MPa to 121 MPa, was observed with two coating layers (each 80 μm thick) being uniformly deposited onto the two primary surfaces of the FG foil. This result is quite striking and further reflects the notion that the GO gel-derived GO layer (a unitary graphene entity or graphene single crystal) is a class of material by itself.

SEM investigation of specimen fracture surfaces has shown that the failure of these foils and laminates was always initiated from the FG foil itself (not from a GO coating layer, if present), and often from a site near a FG surface or edge. The FG surface or edge appears to have abundant surface defects that could serve as a mechanical stress concentration site, promoting crack initiation. The presence of a GO coating layer appears to be capable of significantly smoothing out the surface defects and delaying the crack initiation step. When the stress is sufficiently high, cracks are eventually initiated near the FG surface/edge, leading to final tensile failure.

Another unexpected observation is the notion that the tensile strength of the GO-coated laminate increases monotonically with the increasing GO coating amount, reaching a value of 121 MPa that is one order of magnitude higher than the typical strength of flexible graphite-type materials. This appears to suggest that GO gel has a strong adhering power capable of bonding GO to a graphitic foil and also that GO molecules in a GO gel are capable of combining/integrating with one another to form larger and stronger unitary graphene layers or single crystals that are relatively defect-free, leading to a relatively high cohesive strength.

Examples 8: The Surface Scratch Resistance (in Terms of Scratch Visibility and Scratch Depth), and Hardness of Various Graphene Oxide-Coated Graphitic Foils The scratch test was conducted using the so-called Ford Lab Test Method (FLTM) BN108-13. This apparatus consists of a movable platform connected to five beams with 250 mm in length. A scratch pin is attached to one end of each beam. A highly polished hardened steel ball (1.0±0.1 mm diameter) is placed on the tip of each pin. Each pin is loaded with a weight that exerts a force of 7N, 6N, 3N, 2N, and 0.6N, respectively. Driven by compressed air, the beams draw the pins across the specimen surface and generate scratches. The scratch is made at a sliding velocity of approximately 100 mm/s. All tests were performed at room temperature. Although the test method requires that grained surfaces be evaluated, only the smooth surfaces of the specimens were tested in this study.

After the specimen plaques were scratched, they were evaluated with a reflected light polarizing microscope incorporating a Xenon light source. An image analyzer with Image Analysis Software was used to measure the "gray scale mass," which is the total gray scale value of the object. The camera objective lens is positioned at an angle of 90° from the scratch. The objective lens then registers a portion of the scratch about 1 mm long. The electron signal for each scratch line is then integrated and recorded. The optical mass of an object, M, is the sum of the gray level values, GL, of all pixels in the object. The individual gray level values are assigned by the image analysis program in unit steps in the range of 0-255, where 0=black and 255=white. The optical mass, M, can be computed from: $M = \Sigma GL_i$ (sum over i to n), where n is the number of pixels. The brightness of the object, B, is $B = M/A$, where A represents the area of the object. The percentage change in the brightness between the scratch and the background is the scratch visibility, $\Delta B$, given by $\Delta B = [(B_{scratch} - B_{background})/(B_{background})] \times 100\%$. The depth of the scratch was measured using an interferometer. The magnification was set at 5×. Depth measurements were made from the depth histogram of the scanned area. The scratches were also examined using a scanning electron microscope (SEM).

Indentation hardness tests were also performed on selected specimens. For the Rockwell Hardness test, the ASTM D 785 test procedure was followed. The indenter was a round steel ball with 12.5 mm in diameter (Rockwell R scale). The Rockwell hardness number is a measure of the non-recoverable indentation after a heavy load of 588N for a period of 15 s, and subsequently reduced to a minor load of 98N for another duration of 15 s. Normal hardness is then defined as the load divided by the projected area. Alternatively, the durometer hardness test was performed on some selected specimens according to ASTM D 2240 (type D). A portable testing unit was used. The tester is spring loaded with a protruding hardened steel indenter. The indenter has a 30° sphere-cone with a 0.1 mm tip radius. The depth of penetration was measured using a dial gauge. The scale (the hardness number) is graduated from 0 to 100, where each number represents 0.025 mm indentation.

Figure 5B:
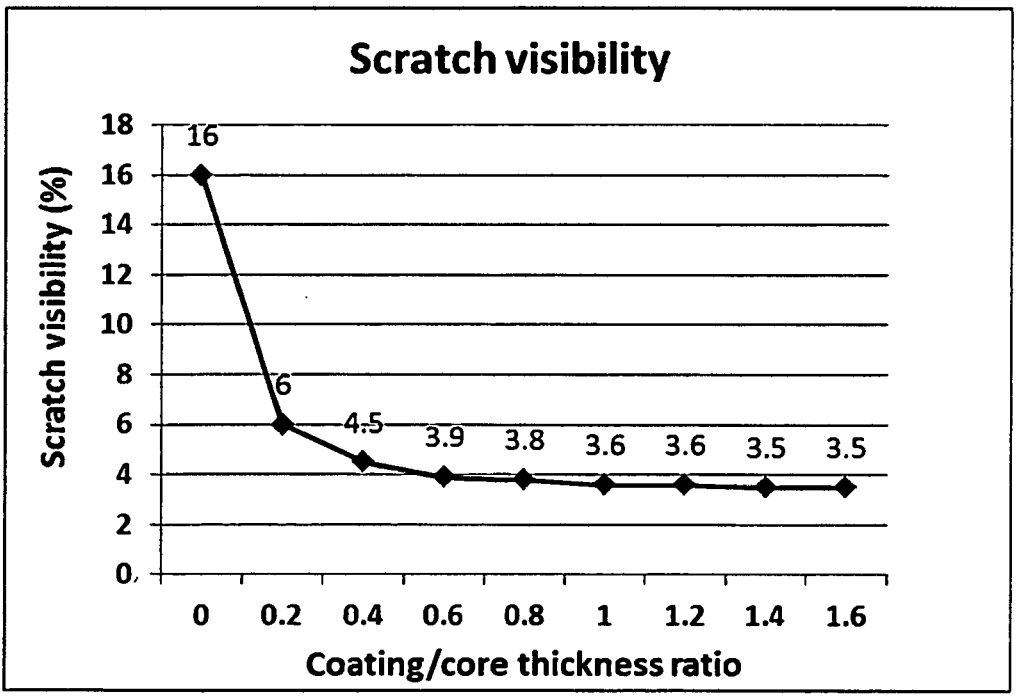
Figure 5C:
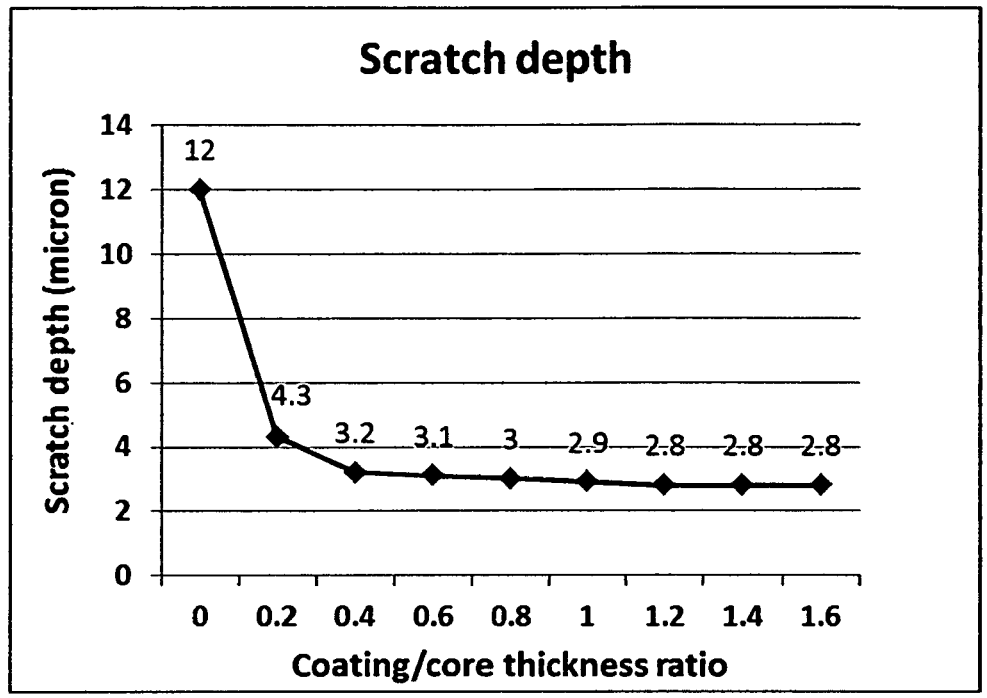
Figure 5D:
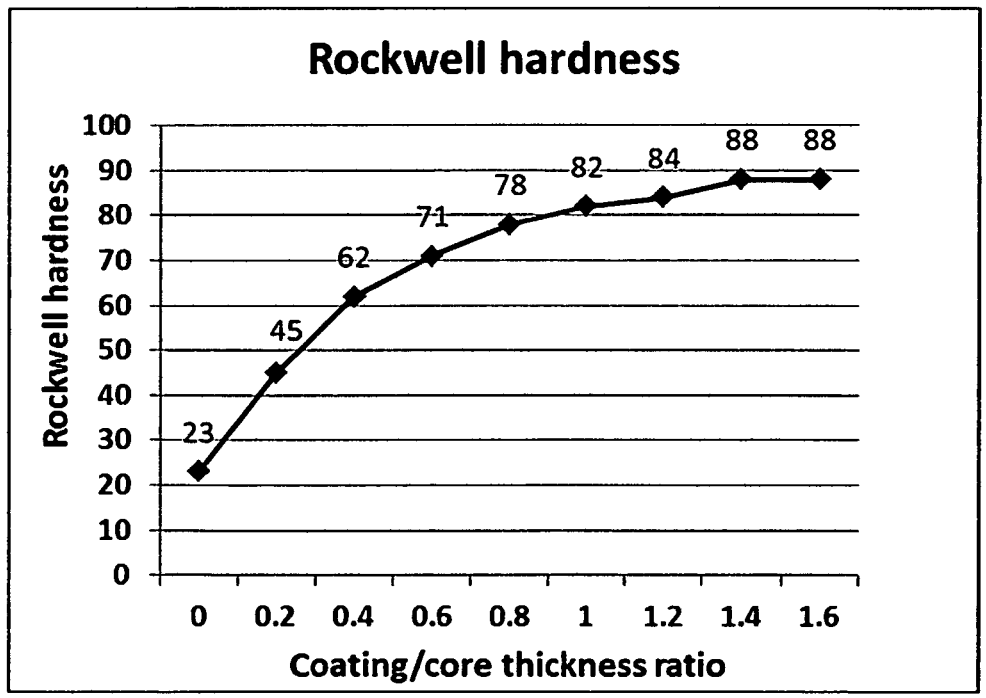

FIGS. 5(b), 5(c), and 5(d) show the scratch visibility, scratch depth, and Rockwell hardness data, respectively, of a series of GO-coated FG foils plotted as a function of the coating-to-core layer thickness ratio. These data indicate that the bare FG foils are not scratch resistant, exhibiting a high level of scratch visibility and deep scratch marks. The scratch resistance is significantly improved by depositing a thin layer of GO coating; the thicker the GO coating, the better the scratch resistance. This scratch resistance is a reflection of improved surface hardness as shown in FIG. 5(d).

Examples 9: Properties of Various Types of Graphene Oxide-Coated Graphitic Foils Examples of graphitic foils investigated include: NGP paper, CNT paper, CNF mat, graphite-epoxy composite films, carbon-carbon composite layer, carbon paper, GO gel-bonded NGP composite, PET-supported CNT film, and PET-supported graphene film (PET film was attached after heat treating GO coating). The physical and mechanical properties of a broad array of GO-coated graphitic foils are summarized in Table 1 below.

TABLE 1

Properties of selected graphitic foils and their GO-coated versions.

| Sample No. | Graphitic core layer & thickness | GO coating temp. and thickness | Elect. Cond. (S/cm) | Thermal cond. (W/mk) | Tensile strength (MPa) | Surface hardness (Rockwell) | Scratch resistance |
|---|---|---|---|---|---|---|---|
| 20-A | NGP paper, 120 μm | None | 1427 | 354 | 27 | 34 | Fair |
| 20-B | NGP paper, 120 μm | 1,500° C.; 40 μm | 4,205 | 765 | 98 | 72 | Excellent |
| 21-A | CNT paper, 126 μm | None | 238 | 67 | 61 | 26 | Fair |
| 21-B | CNT paper, 126 μm | 1,500° C.; 40 μm | 4,122 | 667 | 235 | 88 | Excellent |
| 22-A | CNF mat, 155 μm | None | 162 | 54 | 52 | 28 | Fair |
| 22-B | CNF mat, 155 μm | 1,500° C.; 40 μm | 3825 | 621 | 167 | 82 | Excellent |
| 23-A | Graphite-epoxy, 268 μm | None | 83 | 11 | — | — | — |
| 23-B | Graphite-epoxy, 268 μm | 300° C.; 65 μm | 1224 | 252 | — | — | — |
| 24-A | C/C composite, 232 μm | None | 320 | 88 | — | — | — |
| 24-B | C/C composite, 232 μm | 1,200° C.; 45 μm | 3672 | 617 | — | — | — |
| 25-A | Carbon paper, 156 μm | None | 167 | 61 | 62 | 25 | Poor |
| 25-B | Carbon paper, 156 μm | 2,200° C.; 75 μm | 5,250 | 970 | 165 | 82 | Excellent |
| 26-A | GO gel-bonded NGP composite 103 μm | None | 3,241 | 602 | — | — | — |
| 26-B | GO gel-bonded NGP composite 103 μm | 1,500° C.; 40 μm | 4,725 | 898 | — | — | — |

Note:
Unless otherwise noted, the thermal conductivity and electrical conductivity values are for in-plane. Most of the laminates, by design, exhibit a through-plane (thickness-direction) thermal conductivity typically <10 W/mK, more typically <5 W/mK, and often <1 W/mK).

These data have further demonstrated that a GO coating can significantly improve electric conductivity, thermal conductivity, tensile strength, scratch resistance, and hardness of a graphitic layer. The excellent scratch resistance and surface hardness also result in the reduction or elimination of any graphite or carbon particles from being scratched off the foil surface.

A comparison between Sample 21-A and 21-B and that between 22-A and 22-B reveal a very interesting and significant result. The paper or mat made from CNTs and CNFs, two presumably high-strength materials, show relatively poor strength and hardness. Presumably one could impregnate these porous paper or mat structures with a resin, but that would dramatically curtail the electrical conductivity and thermal conductivity. Instead, by coating both major surfaces of a mat or paper structure with a thin layer of GO gel and then drying and re-graphitizing the GO layer at 1,000° C. for one hour, we have observed that the tensile strengths of both materials were increased by a factor of 3-4. Furthermore, both the thermal conductivity and the electrical conductivity of both CNT paper and CNF mat were increased by one order of magnitude. These exceptional properties, alone or in combination, could not have been achieved with resin-impregnated CNT paper or CNF mat even if the resin matrix is carbonized at 1,500° C. for an extended period of time. It is well-known in the art that carbon/carbon composites, even after repeated resin impregnations and carbonizations, could not reach an electrical conductivity of 1,000 S/cm (typically <<500 S/cm) and could not reach a thermal conductivity of 1,000 W/mK (typically <<300 W/mK).

Figure 6:
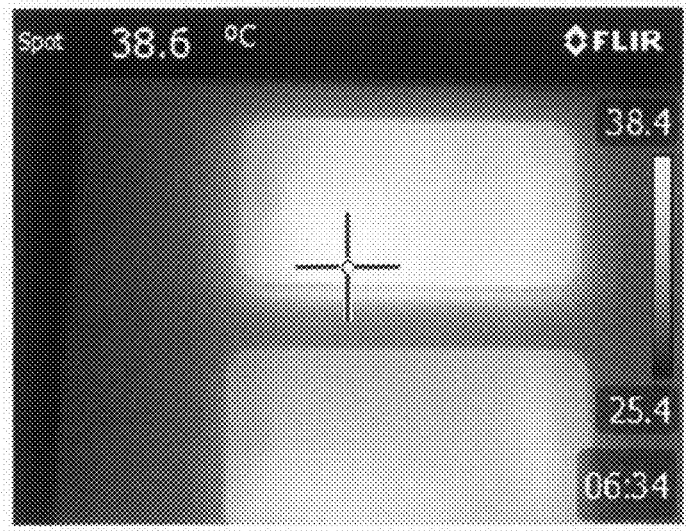
FIG. 6 Surface temperature fields of two identical smart phones running the same video programs for 10 minutes. One smart phone (top image) contains 2 sheets of flexible graphite (FG) foils between the CPU and the casing, showing an external surface temperature as high as 38.6° C. The other smart phone (bottom image) contains one sheet of GO-coated FG foil, showing an external surface temperature of 25.4° C.

Examples 10: Heat Dissipation Systems Containing a Graphene Oxide-Coated Graphitic Foil We have used an infrared thermography-based hand-help device to measure the surface temperatures of a range of microelectronic devices, such as smart phones and laptop computer. For instance, FIG. 6 shows the surface temperature fields of two identical smart phones running the same video programs for 10 minutes. One smart phone (top image) contains 2 sheets of flexible graphite (FG) foils between the CPU and the casing, showing an external surface temperature as high as 38.6° C. The internal temperature near the CPU is presumably much higher than 60 or 70° C., a dangerous temperature that could eventually damage the device. In contrast, the other smart phone (bottom image) contains one sheet of GO-coated FG foil, showing an external surface temperature of 25.4° C. This example has vividly demonstrated the effectiveness of implementing a GO-coated graphitic foil-based heat-spreader layer in a thermal management system.

As indicated in FIGS. 4(a) and 4(b), the presently invented GO-coated graphitic foils for use as a heat spreader layer do not have to go through an ultra-high-temperature graphitization treatment. Graphitization of a carbonized resin (e.g. polyimide) or other carbon materials requires a temperature typically higher than 2,000° C., most typically higher than 2,500° C. The graphitization temperature is most typically in the range of 2,800-3,200° C. in order for carbonized materials or pyrolytic graphite to achieve a thermal conductivity >1,600 W/mK. In contrast, the typical heat treatment temperature (re-graphitization treatment) of the presently invented GO-coated laminates is significantly lower than 2,500° C. and more typically lower than 1,500° (can be as low as 100-150° C.).

For instance, polyimide (PI), if carbonized and graphitized for 5 hours (including 4 hours for carbonization at 1,000-1,500° C. and 1 hour for graphitization at 2,000° C.), exhibits a thermal conductivity of 820 W/mK. In contrast, we were able to reach a thermal conductivity of 876 W/mK with a heat treatment of GO at 500° C. for a total of two hours. This is very surprising and no one has ever thought that such a low graphitization temperature was possible. Further, a heat treatment of the GO-coated graphitic foil at the same 2,000° C. for 1 hour imparts a thermal conductivity of 1,680 W/mK. Clearly, this is a dramatically faster, less energy-intensive, and more cost-effective process. The resulting products are also far superior to pyrolytic graphite. The GO-coated graphitic foil, the GO itself (from GO gel), and the pyrolytic graphite are three fundamentally different and patently distinct classes of materials in terms of chemical composition, morphology, structure, process of production, and various properties.

In conclusion, we have successfully developed a new and novel class of highly conducting material (graphene oxide gel-coated graphitic foil laminates) for use as a heat spreader and heat-shielding layer in a thermal management system. The thermal and electrical conductivities and tensile strength exhibited by the presently invented coated laminate materials are much higher than what prior art flexible graphite sheets or other graphitic films could possibly achieve. The thermal and electrical conductivities exhibited by the presently invented materials are the highest of what graphite-type thin-layer materials (>10 μm) have been able to achieve thus far. These GO-coated graphitic materials have the best combination of excellent electrical conductivity, thermal conductivity, mechanical strength, surface scratch resistance, hardness, and less or no tendency to flake off. The presently invented heat dissipation system enables the associated electronic device to most effectively dissipate the internally generated heat through the assistance of a graphene oxide-coated graphitic foil laminate included therein.

We claim:

1. A heat dissipation system, comprising:
   (a) an electronic device comprising a heat source, wherein the heat source transmits heat to a second component or an external surface of the electronic device;
   (b) a heat-conducting layer comprising two major surfaces, wherein one of said major surfaces is in operative contact with the heat source such that the heat-conducting layer is interposed between the heat source and the second component or the external surface of the electronic device;
   wherein the heat-conducting layer comprises at least one graphene oxide-coated graphitic foil laminate, and wherein the laminate is composed of a graphitic substrate or core layer having two opposed primary surfaces and at least a graphene oxide coating layer deposited directly on at least one of said two primary surfaces, wherein said graphitic substrate or core layer has a thickness greater than 1 nm, and said graphene oxide coating layer has a thickness greater than 1 nm and an oxygen content of 0.01%-40% by weight based on the total graphene oxide coating weight, wherein said graphitic substrate or core layer is selected from the group consisting of flexible graphite foil, graphite particle paper, carbon-carbon composite film, carbon nanofiber paper, carbon nanotube paper, graphene fluoride paper, hydrogenated graphene paper, doped graphene paper, and functionalized graphene paper, wherein said graphene oxide coating layer comprises a unitary graphene layer or a single crystal of graphene planes that are parallel to a graphene oxide coating layer surface, and wherein each unitary graphene layer is a large-scale entity, no less than 10 μm in length or width, and having an integrated layer of highly ordered structure of carbon atoms wherein said graphene oxide-coated graphitic foil laminate exhibits an in-plane thermal conductivity greater than 1,000 W/mK and an in-plane electric conductivity greater than 1,500 S/cm and a thickness-direction thermal conductivity lower than 10 W/mK.

2. The heat dissipation system as defined in claim 1, wherein said oxygen content is from 0.01% to 10% by weight.

3. The heat dissipation system of claim 1, wherein the electronic device further comprises a heat dissipation device positioned in a location not directly adjacent to the heat source and wherein one of the major surfaces of the heat-conducting layer is in operative contact with the heat dissipation device.

4. The heat dissipation system of claim 3, wherein the heat dissipation device comprises a heat sink, a heat pipe, a heat plate, or a combination thereof.

5. The heat dissipation system of claim 1, wherein a thermal transfer material is positioned between the heat-conducting layer and the heat source.

6. The heat dissipation system of claim 5, wherein the thermal transfer material comprises a metal or a thermal interface material.

7. The heat dissipation system of claim 1, wherein the electronic device is a portable computing device containing a central processing unit (CPU), a battery, or a supercapacitor as a heat source.

8. The heat dissipation system of claim 1, wherein the electronic device is a digital camera, a mobile phone, a laptop computer, a tablet, an electronic book or e-book, a power tool, or a hand-held video recording device.

9. The heat dissipation system as defined in claim 1, wherein the graphitic substrate layer or graphene oxide coating layer has a thickness less than 200 μm.

10. The heat dissipation system as defined in claim 1, wherein said graphene oxide-coated graphitic layer has an in-plane electric conductivity greater than 2,000 S/cm.

11. The heat dissipation system as defined in claim 10, wherein said unitary graphene layer or single crystal has a lateral dimension greater than 100 μm.

12. The heat dissipation system as defined in claim 10, wherein said unitary graphene layer or single crystal has a lateral dimension greater than 10 mm.

13. The heat dissipation system as defined in claim 1, wherein said graphene oxide is a reduced graphene oxide having an oxygen content less than 5% by weight.

14. The heat dissipation system as defined in claim 1, wherein said graphene oxide contains a reduced graphene oxide.

15. The heat dissipation system as defined in claim 1, wherein said graphene oxide has an oxygen weight fraction of 23% to 35% and is thermally conductive but not electrically conductive.

16. The heat dissipation system as defined in claim 1, wherein said graphitic foil contains a material selected from natural graphite, artificial graphite, meso-phase carbon, meso-phase pitch, meso-carbon micro-bead, soft carbon, hard carbon, coke, carbon fiber, carbon nano-fiber, carbon nano-tube, or a combination thereof.

17. The heat dissipation system as defined in claim 1, wherein said graphene oxide-coated graphitic foil laminate has a Rockwell hardness value greater than 60.

18. The heat dissipation system as defined in claim 1, wherein said graphene oxide-coated graphitic foil laminate has an in-plane thermal conductivity greater than 1,700 W/mK or through-plane thermal conductivity less than 5 W/mK.

19. The heat dissipation system as defined in claim 1, wherein said graphene oxide-coated graphitic foil laminate has an in-plane electrical conductivity greater than 5,000 S/cm.

20. The heat dissipation system as defined in claim 1, wherein said graphene oxide-coated graphitic foil laminate has an in-plane electrical conductivity greater than 3,000 S/cm.

21. The heat dissipation system as defined in claim 1, wherein said graphene oxide-coated graphitic foil laminate has an electrical conductivity greater than 1,500 S/cm, a physical density greater than 1.4 g/cm3, and a tensile strength greater than 10 MPa.

22. The heat dissipation system as defined in claim 1, wherein said graphene oxide-coated graphitic foil laminate has an in-plane electrical conductivity greater than 2,000 S/cm, a physical density greater than 1.8 g/cm3, and a tensile strength greater than 40 MPa.

23. The heat dissipation system as defined in claim 1, wherein said graphene oxide-coated graphitic foil laminate has an in-plane electrical conductivity greater than 5,000 S/cm, an in-plane thermal conductivity greater than 1,500 W/mK, a physical density greater than 2.0 g/cm$^3$, and a tensile strength greater than 60 MPa.

24. The heat dissipation system of claim 1, wherein said graphene oxide coating layer is deposited on each of said two primary surfaces of said graphitic core layer.

25. The heat dissipation system of claim 1, wherein at least one of said graphene oxide coating layer is further deposited with a layer of electrically insulating material.

26. A heat dissipation system, comprising:
(A) an electronic device comprising a heat source, wherein the heat source transmits heat to a second component or an external surface of the electronic device;
(B) a heat-conducting layer comprising two major surfaces, the heat-conducting layer being positioned such that one of its major surfaces is in operative contact with the heat source such that it is interposed between the heat source and the second component or the external surface of the electronic device;
wherein the heat-conducting layer comprises at least one graphene oxide-coated graphitic foil laminate, and wherein the laminate is composed of a graphitic substrate or core layer having two opposed primary surfaces and at least a graphene oxide coating layer deposited on at least one of said two primary surfaces, wherein said graphene oxide coating layer contains a unitary graphene layer or graphene single crystal and has an oxygen content of less than 5% by weight based on the total graphene oxide weight, wherein said graphitic substrate or core layer is selected from the group consisting of flexible graphite foil, graphite particle paper, carbon-carbon composite film, carbon nanofiber paper, carbon nanotube paper, graphene fluoride paper, hydrogenated graphene paper, doped graphene paper, and functionalized graphene paper, wherein said graphene oxide coating layer comprises a unitary graphene layer or a single crystal of graphene planes that are parallel to a graphene oxide coating layer surface, and wherein each unitary graphene layer is a large-scale entity, no less than 10 μm in length, and having an integrated layer of highly ordered structure of carbon atoms wherein said graphene oxide-coated graphitic foil laminate exhibits an in-plane thermal conductivity greater than 1,000 W/mK and an in-plane electric conductivity greater than 1,500 S/cm and a thickness-direction thermal conductivity lower than 10 W/mK.

* * * * *